US012652928B2

(12) United States Patent　　　　　(10) Patent No.: US 12,652,928 B2

Fukuda　　　　　　　　　　　　　　　(45) Date of Patent:　　　Jun. 9, 2026

(54) DISPLAY DEVICE AND MANUFACTURING METHOD THEREOF

(71) Applicant: Magnolia White Corporation, Tokyo (JP)

(72) Inventor: Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 460 days.

(21) Appl. No.: 18/481,249

(22) Filed: Oct. 5, 2023

(65) Prior Publication Data

US 2024/0147811 A1　　May 2, 2024

(30) Foreign Application Priority Data

Nov. 1, 2022　　(JP) ................................. 2022-175609

(51) Int. Cl.
| | |
|---|---|
| *H10K 59/80* | (2023.01) |
| *H10K 71/16* | (2023.01) |
| *H10K 71/60* | (2023.01) |
| *H10K 102/00* | (2023.01) |

(52) U.S. Cl.
CPC ..... *H10K 59/80518* (2023.02); *H10K 71/164* (2023.02); *H10K 71/60* (2023.02); *H10K 2102/351* (2023.02)

(58) Field of Classification Search
CPC ......... H10K 59/80518; H10K 59/1201; H10K 59/122; H10K 71/164; H10K 71/60; H10K 2102/351
See application file for complete search history.

(56) References Cited

U.S. PATENT DOCUMENTS

| | | |
|---|---|---|
| 2004/0160170 A1 | 8/2004 | Sato et al. |
| 2009/0009069 A1 | 1/2009 | Takata |
| 2019/0363275 A1 | 11/2019 | Ochi et al. |
| 2022/0077251 A1 | 3/2022 | Choung et al. |

FOREIGN PATENT DOCUMENTS

| | | | |
|---|---|---|---|
| DE | 102022205372 A1 * | 12/2022 | ........... H10K 77/111 |
| JP | 2000-195677 A | 7/2000 | |
| JP | 2004-207217 A | 7/2004 | |
| JP | 2008-135325 A | 6/2008 | |
| JP | 2009-032673 A | 2/2009 | |
| JP | 2010-118191 A | 5/2010 | |
| WO | 2018/179308 A1 | 10/2018 | |

* cited by examiner

*Primary Examiner* — Anne M Hines
*Assistant Examiner* — Jose M Diaz
(74) *Attorney, Agent, or Firm* — XSENSUS LLP

(57) ABSTRACT

According to one embodiment, a display device includes a first base electrode, a rib, a partition including a conductive lower portion and an upper portion, a first lower electrode electrically connected to the first base electrode, a first organic layer, and a first upper electrode. The rib includes a first rib layer which is formed of a first inorganic insulating material and covers a peripheral portion of the first base electrode, and a second rib layer which is formed of a second inorganic insulating material different from the first inorganic insulating material and is provided between the lower portion and the first rib layer. The second rib layer protrudes from a side surface of the first rib layer and a side surface of the lower portion.

20 Claims, 22 Drawing Sheets

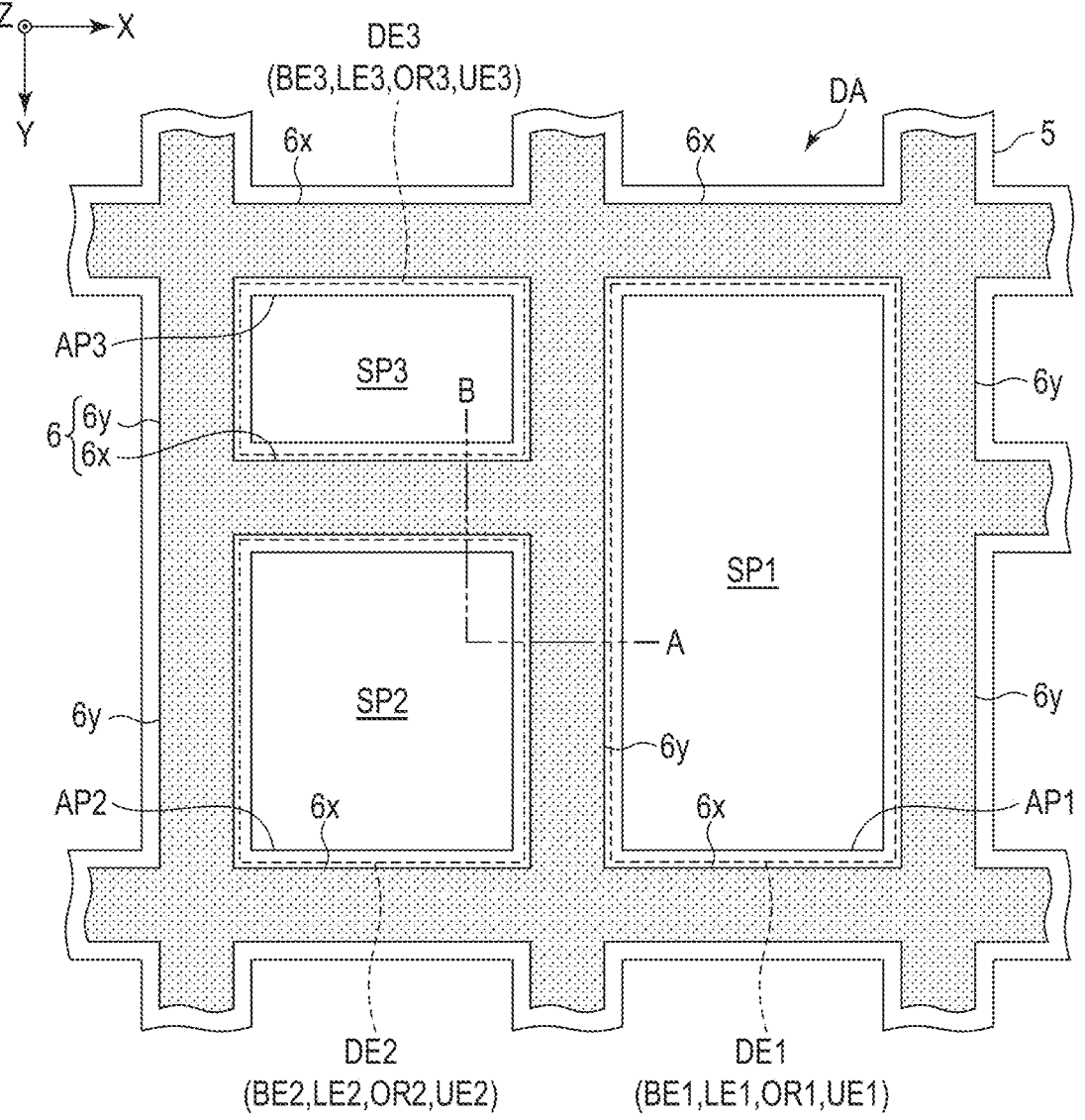
F I G. 2

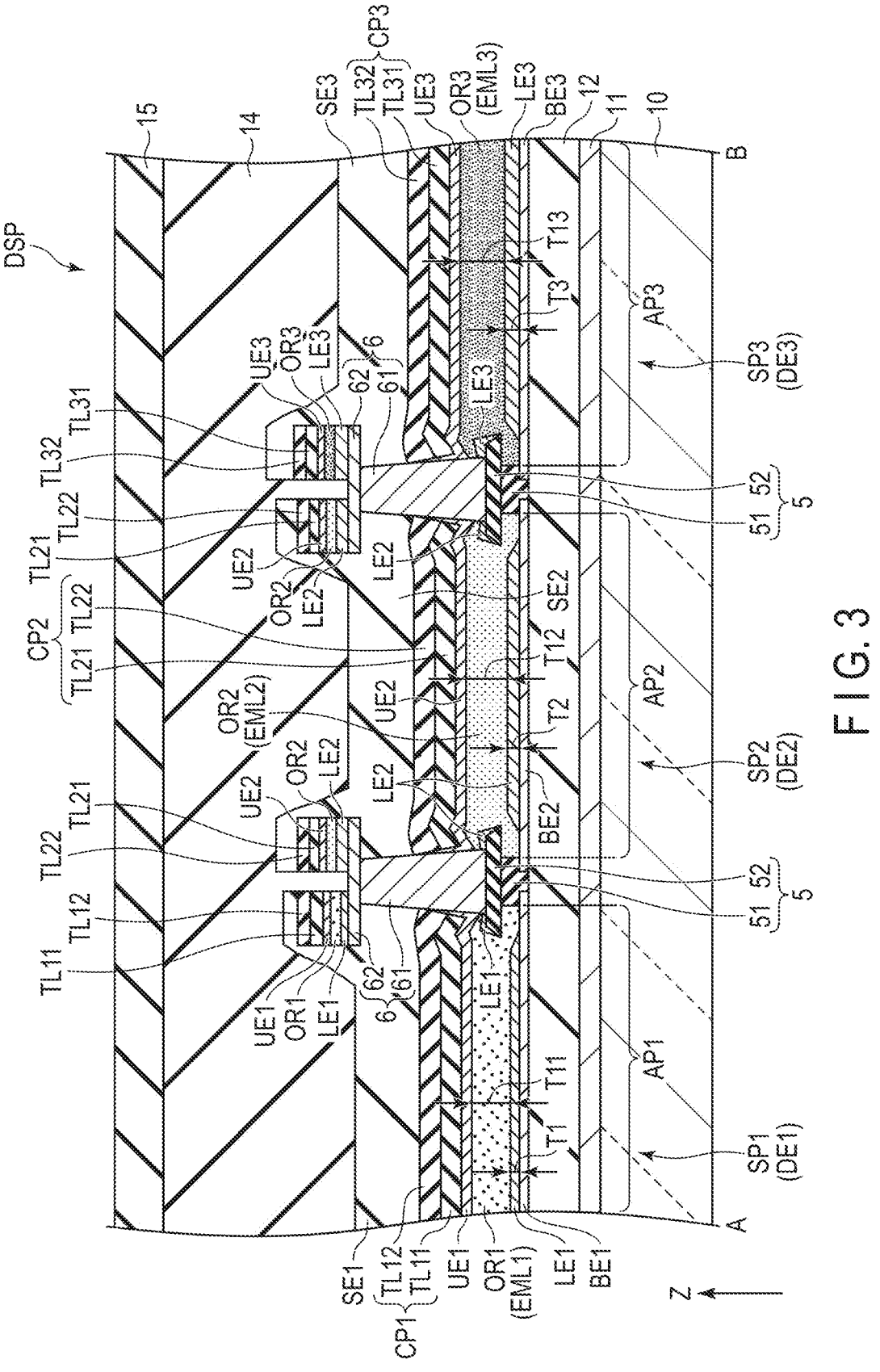
F I G. 3

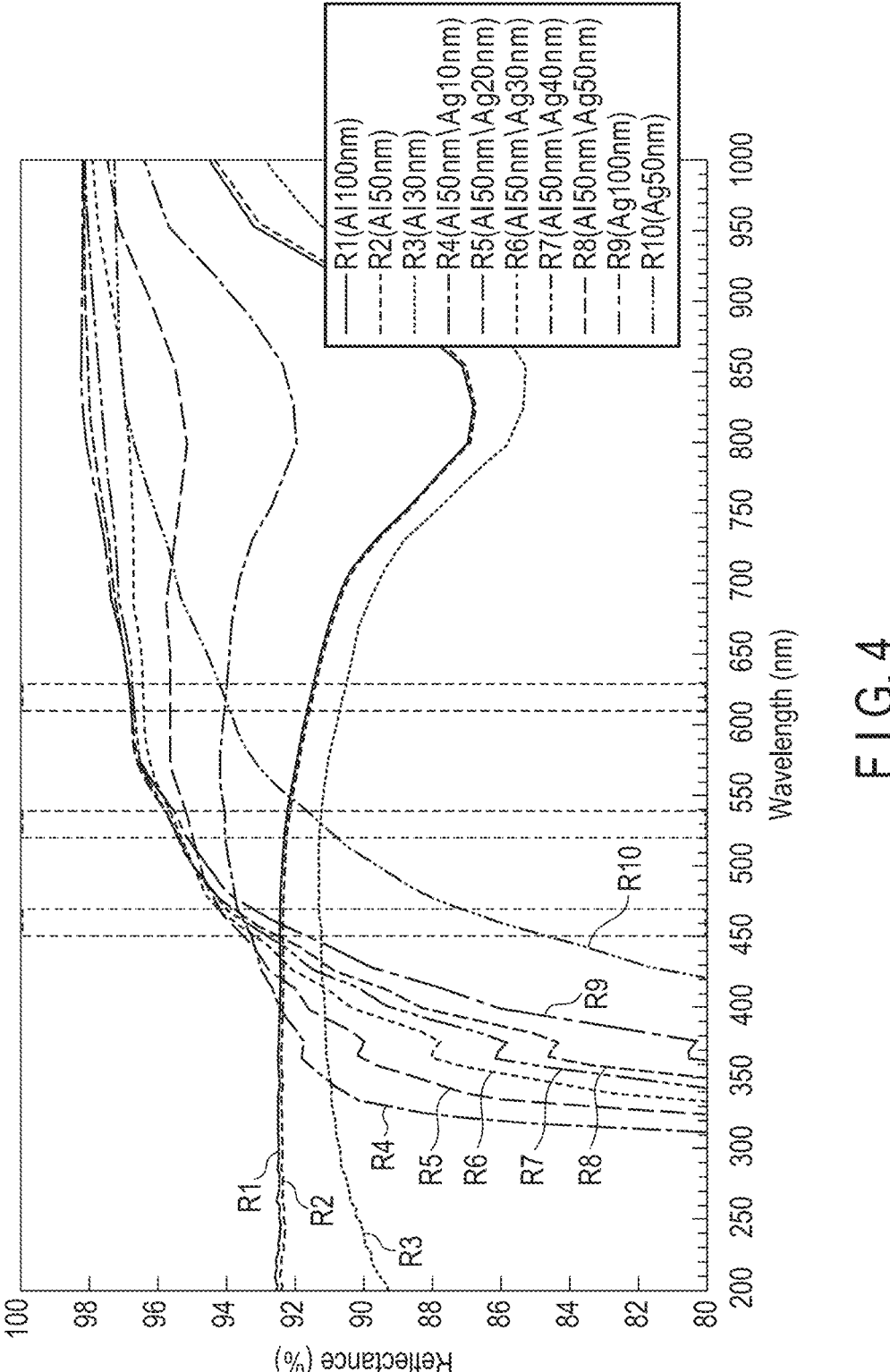
F I G. 4

OR1,OR2,OR3

| EIL |
| --- |
| ETL |
| HBL |
| EML |
| EBL |
| HTL |
| HIL |

$Z$

F I G. 6

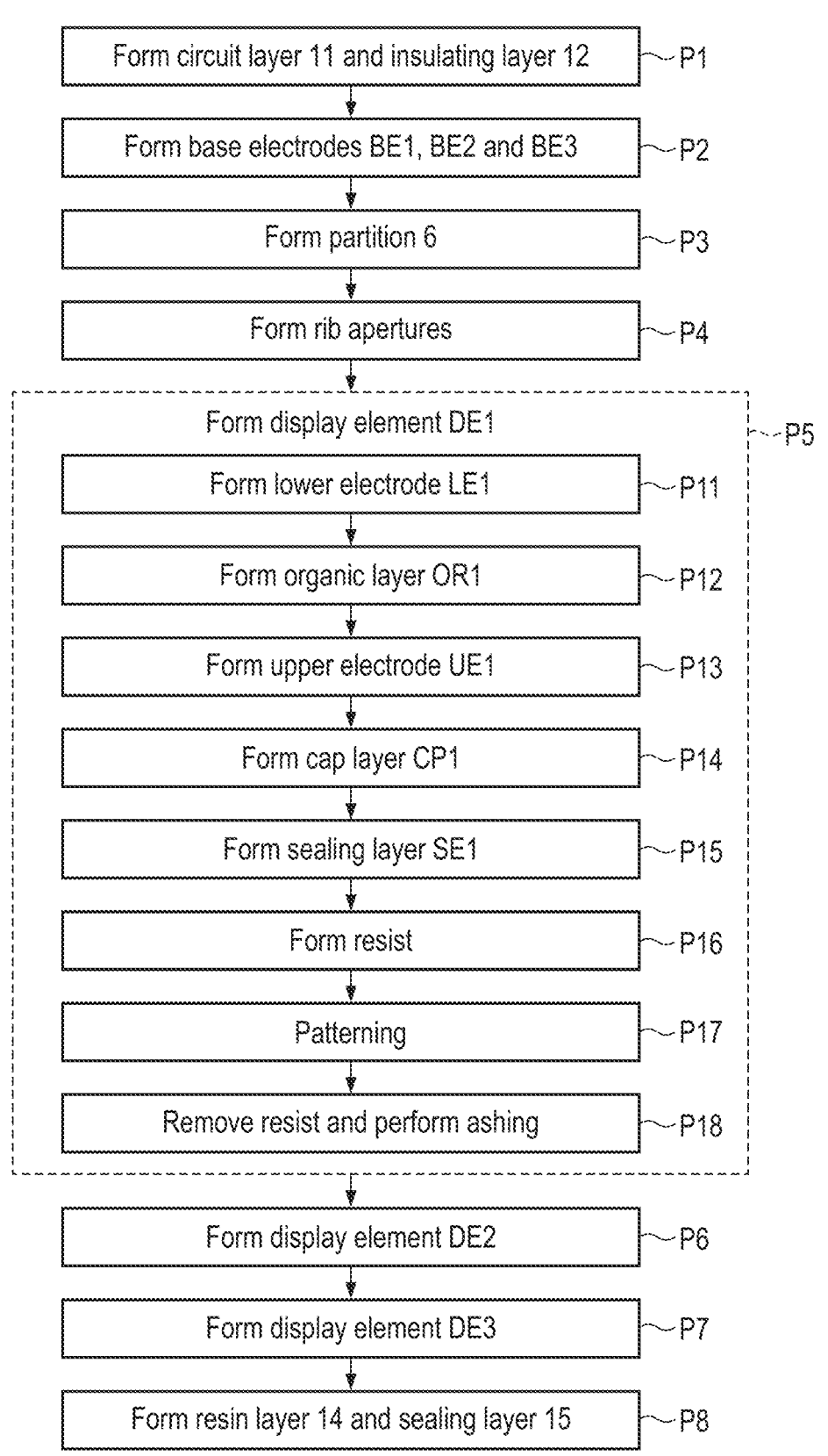
F I G. 8

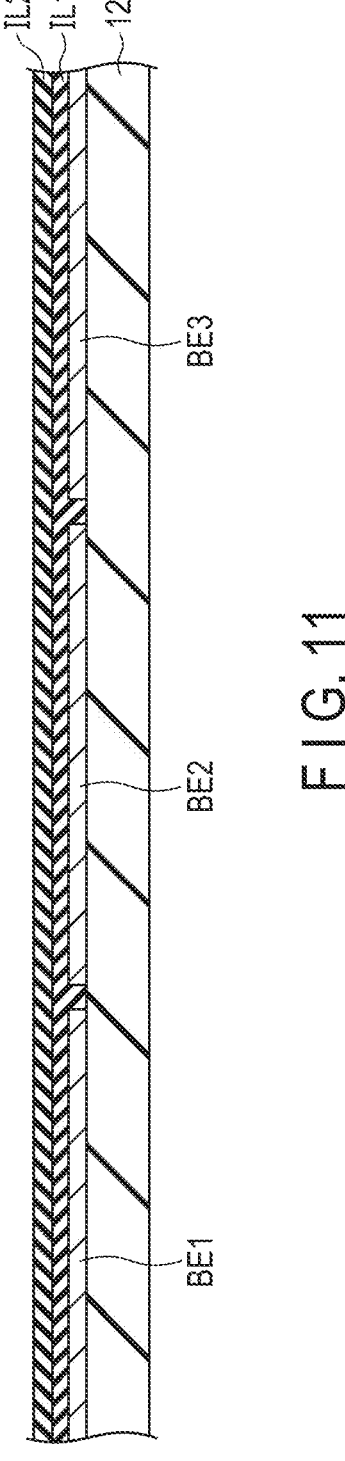
F I G. 11

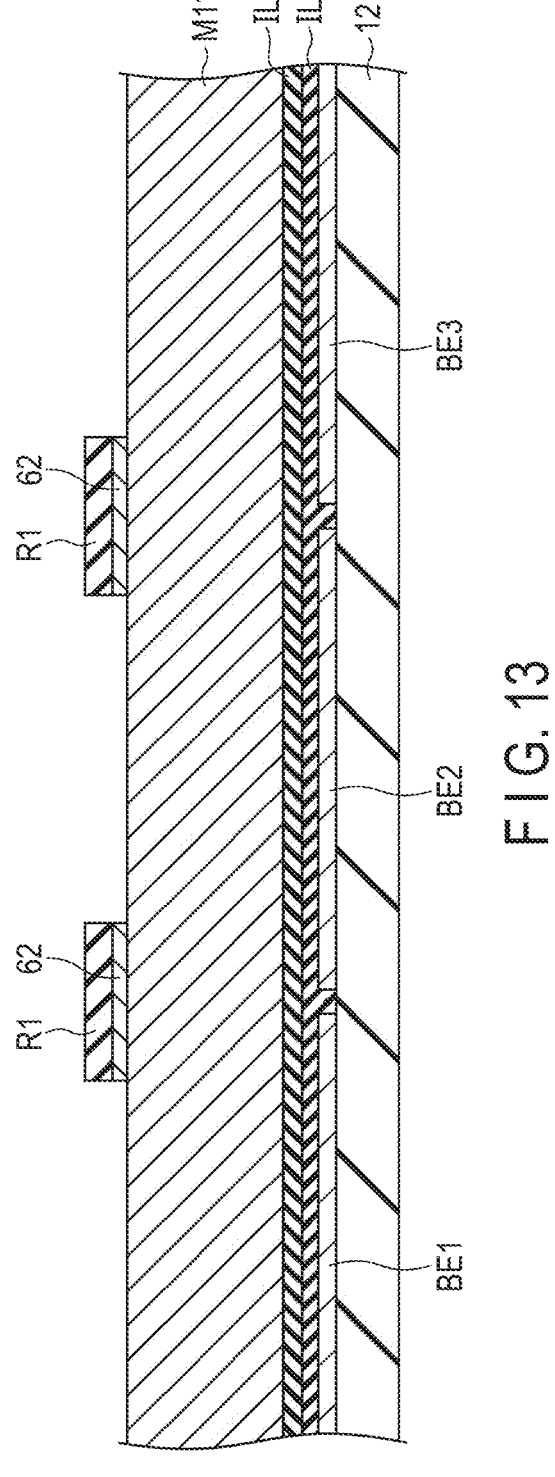
F I G. 13

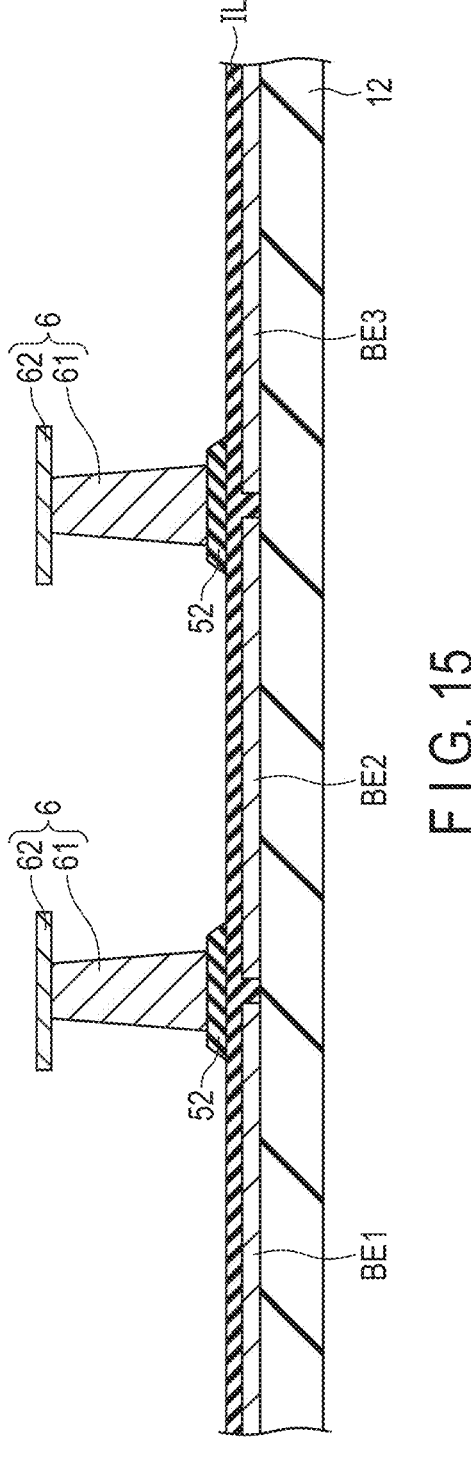
F I G. 15

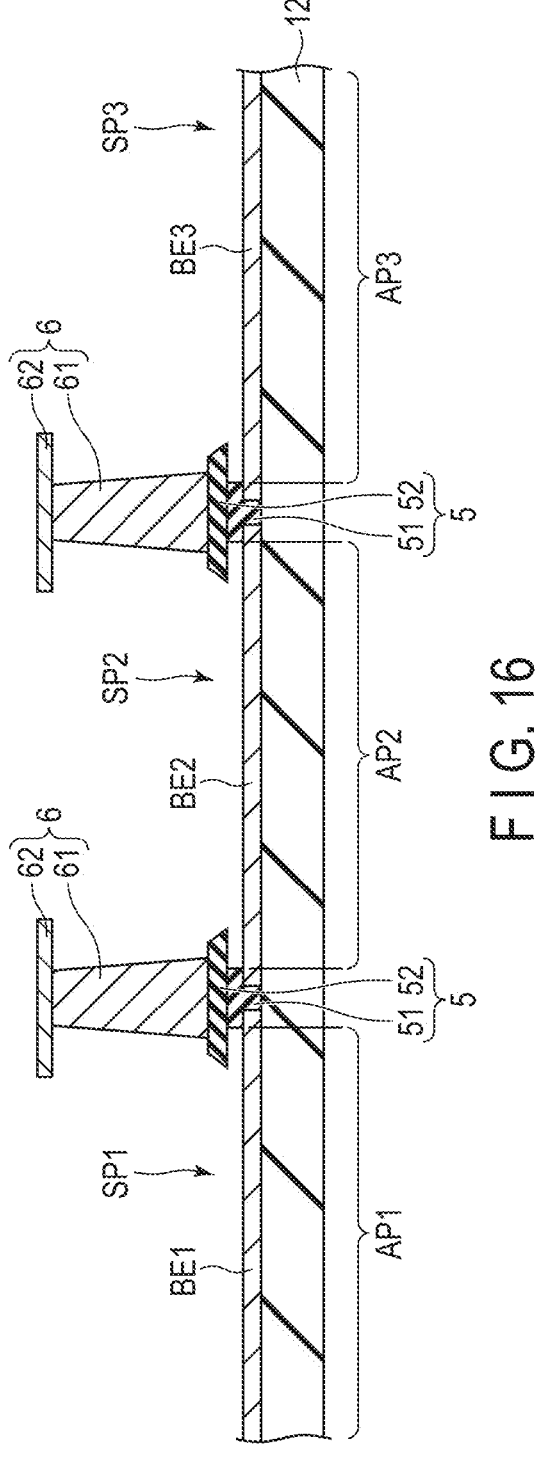
F I G. 16

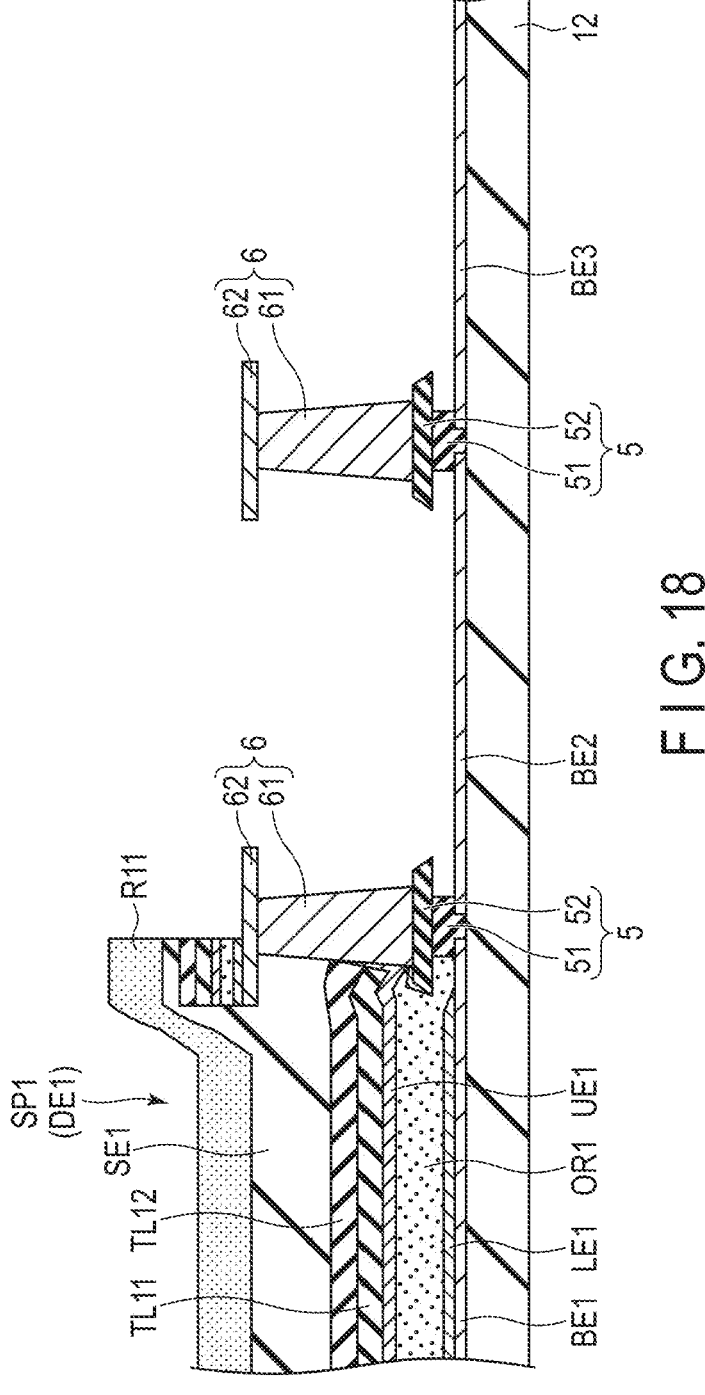
F I G. 18

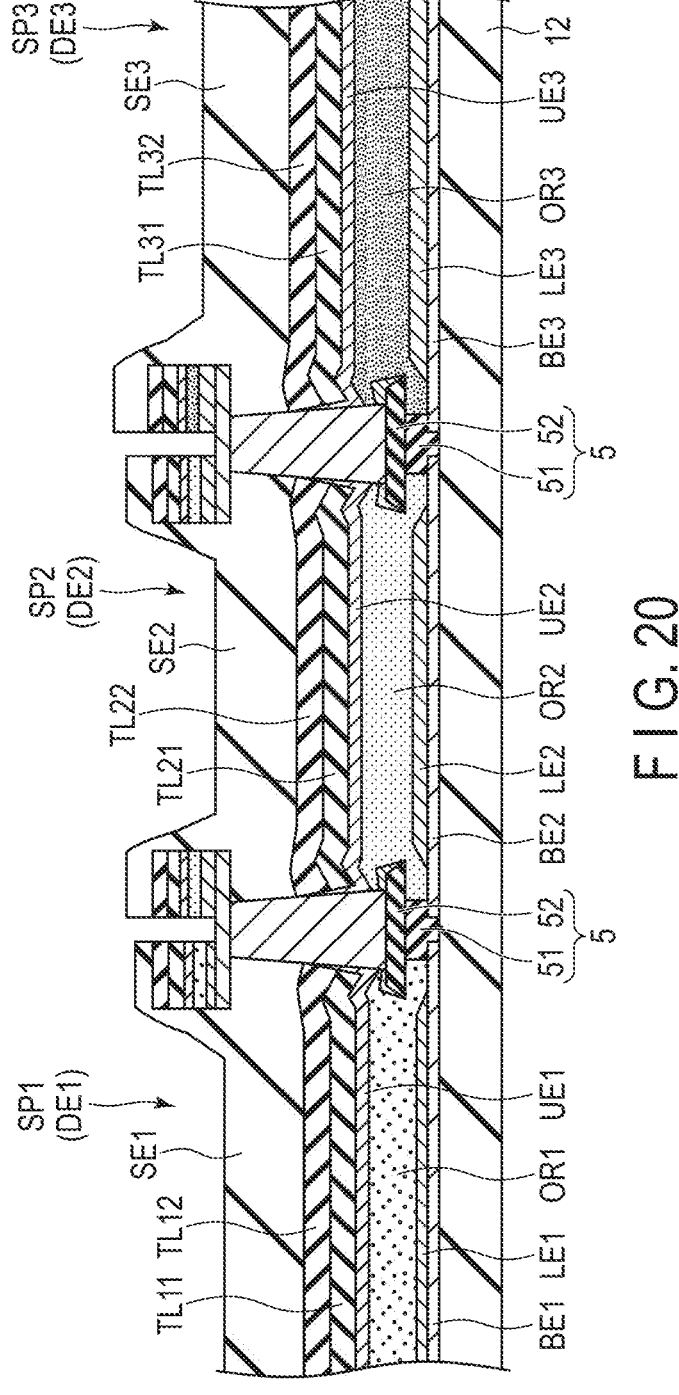
F I G. 20

DISPLAY DEVICE AND MANUFACTURING METHOD THEREOF

CROSS-REFERENCE TO RELATED APPLICATIONS

This application is based upon and claims the benefit of priority from Japanese Patent Application No. 2022-175609, filed Nov. 1, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

In the display devices described above, a technique which improves the luminous efficiency of the display element is required.

BRIEF DESCRIPTION OF THE DRAWINGS

FIG. 2 is a diagram showing an example of the layout of subpixels SP1, SP2 and SP3.

FIG. 3 is a cross-sectional view showing a configuration example of the display device DSP along the A-B line of FIG. 2.

FIG. 4 is a diagram showing the simulation results of reflectance.

FIG. 6 is a diagram showing an example of a layer structure which could be applied to the organic layers OR1, OR2 and OR3.

FIG. 8 is a flowchart showing an example of the manufacturing method of the display device DSP.

FIG. 11 is a schematic cross-sectional view showing a manufacturing process following FIG. 10.

FIG. 13 is a schematic cross-sectional view showing a manufacturing process following FIG. 12.

FIG. 15 is a schematic cross-sectional view showing a manufacturing process following FIG. 14.

FIG. 16 is a schematic cross-sectional view showing a manufacturing process following FIG. 15.

FIG. 18 is a schematic cross-sectional view showing a manufacturing process following FIG. 17.

FIG. 20 is a schematic cross-sectional view showing a manufacturing process following FIG. 19.

DETAILED DESCRIPTION

Figure 1:
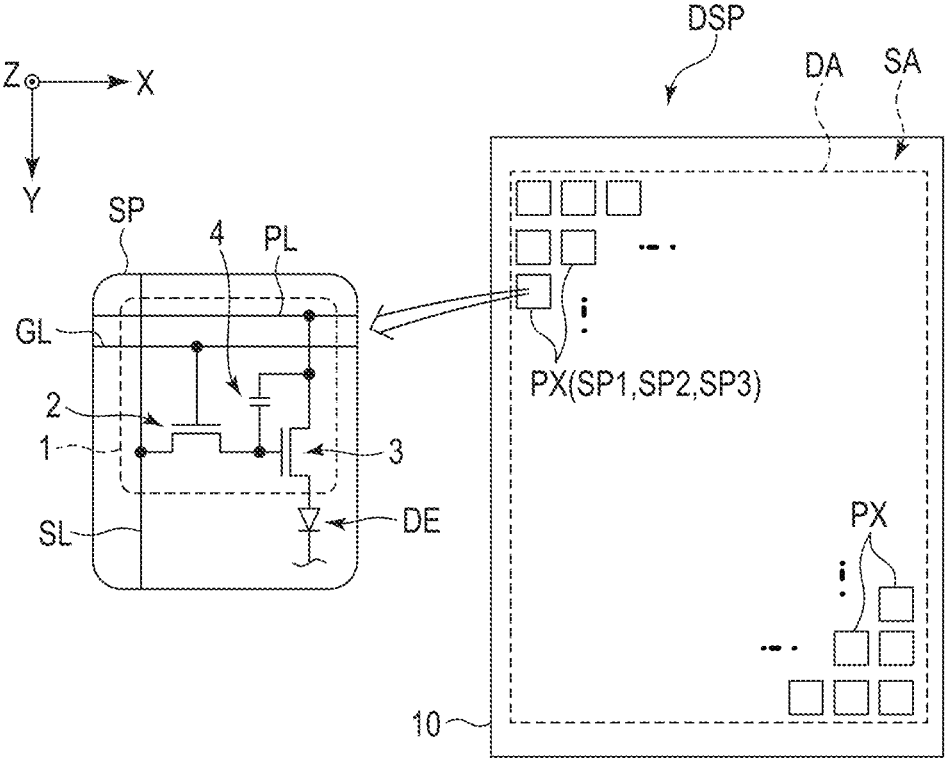
FIG. 1 is a diagram showing a configuration example of a display device DSP according to an embodiment.

In general, according to one embodiment, a display device comprises a substrate, a first base electrode formed of a first metal material and provided above the substrate, a rib comprising an aperture which overlaps the first base electrode, a partition which includes a conductive lower portion provided on the rib and an upper portion protruding from a side surface of the lower portion, a first lower electrode which is formed of a second metal material different from the first metal material, is spaced apart from the lower portion, is provided in the aperture and is electrically connected to the first base electrode, a first organic layer configured to emit light which exhibits a first color and covering the first lower electrode, and a first upper electrode which is provided on the first organic layer and is in contact with the lower portion. The rib comprises a first rib layer which is formed of a first inorganic insulating material and covers a peripheral portion of the first base electrode, and a second rib layer which is formed of a second inorganic insulating material different from the first inorganic insulating material and is provided between the lower portion and the first rib layer. The second rib layer protrudes from a side surface of the first rib layer and a side surface of the lower portion.

According to another embodiment, a manufacturing method of a display device comprises forming a metal layer using a first metal material above a substrate, forming a first base electrode by patterning the metal layer, forming a first insulating layer which covers the first base electrode by a first inorganic insulating material, forming a second insulating layer using a second inorganic insulating material different from the first inorganic insulating material on the first insulating layer, forming a partition which includes a conductive lower portion located on the second insulating layer and an upper portion protruding from a side surface of the lower portion, forming a second rib layer which protrudes from a side surface of the lower portion by patterning the second insulating layer, forming an aperture which overlaps the first base electrode by removing, of the first insulating layer, a portion exposed from the second rib layer, and forming a first rib layer having a width less than the second rib layer by reducing a width of the first insulating layer, forming a first lower electrode electrically connected to the first base electrode by depositing a second metal material different from the first metal material, forming a first organic layer on the first lower electrode, and forming a first upper electrode which is located on the first organic layer and is in contact with the lower portion.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various elements are viewed parallel to the third direction Z, the appearance is defined as a plan view.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP according to an embodiment.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a blue subpixel SP1, a green subpixel SP2 and a red subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE.

It should be noted that the configuration of the pixel circuit 1 is not limited to the example shown in the figure. For example, the pixel circuit 1 may comprise more thin-film transistors and capacitors.

The display element DE is an organic light emitting diode (OLED) as a light emitting element, and may be called an organic EL element.

Although not described in detail, a terminal for connecting an IC chip and a flexible printed circuit is provided in the surrounding area SA.

FIG. 2 is a diagram showing an example of the layout of subpixels SP1, SP2 and SP3.

In the example of FIG. 2, subpixels SP2 and SP3 are arranged in the second direction Y. Subpixels SP1 and SP2 are arranged in the first direction X, and subpixels SP1 and SP3 are arranged in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 is provided in the display area DA. The rib 5 comprises apertures AP1, AP2 and AP3 in subpixels SP1, SP2 and SP3, respectively.

Subpixels SP1, SP2 and SP3 comprise display elements DE1, DE2 and DE3, respectively, as the display elements DE.

The display element DE1 includes a base electrode BE1, a lower electrode LE1, an organic layer OR1 and an upper electrode UE1 overlapping the aperture AP1 as seen in plan view. The organic layer OR1 includes a light emitting layer which emits light in a blue wavelength range. The base electrode BE1 and the lower electrode LE1 are electrically connected to each other.

The display element DE2 includes a base electrode BE2, a lower electrode LE2, an organic layer OR2 and an upper electrode UE2 overlapping the aperture AP2 as seen in plan view. The organic layer OR2 includes a light emitting layer which emits light in a green wavelength range. The base electrode BE2 and the lower electrode LE2 are electrically connected to each other.

The display element DE3 includes a base electrode BE3, a lower electrode LE3, an organic layer OR3 and an upper electrode UE3 overlapping the aperture AP3 as seen in plan view. The organic layer OR3 includes a light emitting layer which emits light in a red wavelength range. The base electrode BE3 and the lower electrode LE3 are electrically connected to each other.

In the boundaries of subpixels SP1, SP2 and SP3, a partition 6 is provided. The partition 6 comprises a plurality of first partitions 6x extending in the first direction X and a plurality of second partitions 6y extending in the second direction Y. In the example of FIG. 2, the first partitions 6x and the second partitions 6y are connected to each other. In this manner, the partition 6 is formed into a grating shape which surrounds the display elements DE1, DE2 and DE3 as a whole. In other words, the partition 6 comprises an aperture in each of subpixels SP1, SP2 and SP3.

In FIG. 2, the outer shapes of the base electrodes BE1, BE2 and BE3, the outer shapes of the lower electrodes LE1, LE2 and LE3, the outer shapes of the organic layers OR1, OR2 and OR3 and the outer shapes of the upper electrodes UE1, UE2 and UE3 are shown by dotted lines. However, the outer shapes of the base electrodes, the lower electrodes, the organic layers or the upper electrodes do not necessarily reflect the accurate shapes.

The peripheral portion of each of the base electrodes BE1, BE2 and BE3, the peripheral portion of each of the lower electrodes LE1, LE2 and LE3, the peripheral portion of each of the organic layers OR1, OR2 and OR3 and the peripheral portion of each of the upper electrodes UE1, UE2 and UE3 overlap the rib 5 as seen in plan view.

The base electrodes BE1, BE2 and BE3 and the lower electrodes LE1, LE2 and LE3 correspond to, for example, the anodes of the display elements. The upper electrodes UE1, UE2 and UE3 correspond to the cathodes of the display elements or a common electrode.

The base electrode BE1 and the lower electrode LE1 are electrically connected to the pixel circuit 1 (see FIG. 1) of subpixel SP1. The base electrode BE2 and the lower electrode LE2 are electrically connected to the pixel circuit 1 of subpixel SP2. The base electrode BE3 and the lower electrode LE3 are electrically connected to the pixel circuit 1 of subpixel SP3.

In the example of FIG. 2, the area of the aperture AP1 which overlaps the base electrode BE1, the area of the aperture AP2 which overlaps the base electrode BE2 and the area of the aperture AP3 which overlaps the base electrode BE3 are different from each other.

The area of the aperture AP2 is less than that of the aperture AP1, and the area of the aperture AP3 is less than that of the aperture AP2. In other words, the area of the base electrode BE2 exposed from the aperture AP2 is less than that of the base electrode BE1 exposed from the aperture AP1. The area of the base electrode BE3 exposed from the aperture AP3 is less than that of the base electrode BE2 exposed from the aperture AP2.

FIG. 3 is a cross-sectional view showing a configuration example of the display device DSP along the A-B line of FIG. 2.

A circuit layer 11 is provided on the substrate 10. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 is an organic insulating layer which planarizes the irregularities formed by the circuit layer 11.

The base electrodes BE1, BE2 and BE3 are provided on the insulating layer 12 and are spaced apart from each other. The base electrodes BE1, BE2 and BE3 are connected to the pixel circuits 1 of subpixels SP1, SP2 and SP3, respectively, through contact holes provided in the insulating layer 12.

The rib 5 comprises a first rib layer 51 and a second rib layer 52. The first rib layer 51 is provided on the insulating layer 12 and covers the peripheral portions of the base electrodes BE1, BE2 and BE3. Between, of the base electrodes BE1, BE2 and BE3, the base electrodes which are adjacent to each other, the insulating layer 12 is covered with the first rib layer 51. The second rib layer 52 is provided on the first rib layer 51. The width of the second rib layer 52 is greater than that of the first rib layer 51.

The apertures AP1, AP2 and AP3 of the rib 5 correspond to through holes formed in the first rib layer 51. The aperture AP1 overlaps the base electrode BE1. The aperture AP2 overlaps the base electrode BE2. The aperture AP3 overlaps the base electrode BE3. In the rib 5 between subpixel SP1 and subpixel SP2, the second rib layer 52 protrudes toward the aperture AP1 and the aperture AP2. In the rib 5 between subpixel SP2 and subpixel SP3, the second rib layer 52 protrudes toward the aperture AP2 and the aperture AP3.

The partition 6 includes a conductive lower portion 61 provided on the second rib layer 52 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. These shapes of the rib 5 and the partition 6 are called an overhang shape.

The lower electrode LE1 is provided on the base electrode BE1 exposed from the aperture AP1 and is in contact with the base electrode BE1. The lower electrode LE1 is spaced apart from the lower portion 61. Part of the lower electrode LE1 is located on the second rib layer 52 and is spaced apart from the portion located on the base electrode BE1. The organic layer OR1 is in contact with the lower electrode LE1 and covers the lower electrode LE1. The peripheral portion of the organic layer OR1 is located on the second rib layer 52. The upper electrode UE1 covers the organic layer OR1 and is in contact with the lower portion 61.

The lower electrode LE2 is provided on the base electrode BE2 exposed from the aperture AP2 and is in contact with the base electrode BE2. The lower electrode LE2 is spaced apart from the lower portion 61. Part of the lower electrode LE2 is located on the second rib layer 52 and is spaced apart from the portion located on the base electrode BE2. The organic layer OR2 is in contact with the lower electrode LE2 and covers the lower electrode LE2. The peripheral portion of the organic layer OR2 is located on the second rib layer 52. The upper electrode UE2 covers the organic layer OR2 and is in contact with the lower portion 61.

The lower electrode LE3 is provided on the base electrode BE3 exposed from the aperture AP3 and is in contact with the base electrode BE3. The lower electrode LE3 is spaced apart from the lower portion 61. Part of the lower electrode LE3 is located on the second rib layer 52 and is spaced apart from the portion located on the base electrode BE3. The organic layer OR3 is in contact with the lower electrode LE3 and covers the lower electrode LE3. The peripheral portion of the organic layer OR3 is located on the second rib layer 52. The upper electrode UE3 covers the organic layer OR3 and is in contact with the lower portion 61.

In the example of FIG. 3, subpixel SP1 comprises a cap layer CP1 and a sealing layer SE1. Subpixel SP2 comprises a cap layer CP2 and a sealing layer SE2. Subpixel SP3 comprises a cap layer CP3 and a sealing layer SE3. The cap layers CP1, CP2 and CP3 function as optical adjustment layers which improve the extraction efficiency of the light emitted from the organic layers OR1, OR2 and OR3, respectively.

The cap layer CP1 comprises a transparent layer TL11 provided on the upper electrode UE1 and a transparent layer TL12 provided on the transparent layer TL11. The refractive index of the transparent layer TL12 is less than that of the transparent layer TL11.

The cap layer CP2 comprises a transparent layer TL21 provided on the upper electrode UE2 and a transparent layer TL22 provided on the transparent layer TL21. The refractive index of the transparent layer TL22 is less than that of the transparent layer TL21.

The cap layer CP3 comprises a transparent layer TL31 provided on the upper electrode UE3 and a transparent layer TL32 provided on the transparent layer TL31. The refractive index of the transparent layer TL32 is less than that of the transparent layer TL31.

Thus, the transparent layers TL11, TL21 and TL31 correspond to the high-refractive layers of the cap layers. The transparent layers TL12, TL22 and TL32 correspond to the low-refractive layers of the cap layers. Each of the cap layers CP1, CP2 and CP3 may be a stacked layer body consisting of three or more layers. It should be noted that the cap layers CP1, CP2 and CP3 may be omitted.

The sealing layer SE1 is provided on the transparent layer TL12 and is in contact with the partition 6. Specifically, the sealing layer SE1 continuously covers the display element DE1 including the lower electrode LE1, the organic layer OR1, the upper electrode UE1 and the cap layer CP1 and the partition 6 around the display element DE1. For example, the refractive index of the sealing layer SE1 is greater than that of the transparent layer TL12.

The sealing layer SE2 is provided on the transparent layer TL22 and is in contact with the partition 6. Specifically, the sealing layer SE2 continuously covers the display element DE2 including the lower electrode LE2, the organic layer OR2, the upper electrode UE2 and the cap layer CP2 and the partition 6 around the display element DE2. For example, the refractive index of the sealing layer SE2 is greater than that of the transparent layer TL22.

The sealing layer SE3 is provided on the transparent layer TL32 and is in contact with the partition 6. Specifically, the sealing layer SE3 continuously covers the display element DE3 including the lower electrode LE3, the organic layer OR3, the upper electrode UE3 and the cap layer CP3 and the partition 6 around the display element DE3. For example, the refractive index of the sealing layer SE3 is greater than that of the transparent layer TL32.

In the example of FIG. 3, the lower electrode LE1, the organic layer OR1, the upper electrode UE1 and the cap layer CP1 are partly located on the partition 6 around subpixel SP1. These portions are spaced apart from, of the lower electrode LE1, the organic layer OR1, the upper electrode UE1 and the cap layer CP1, the portions located in the aperture AP1 (the portions constituting the display element DE1).

Similarly, the lower electrode LE2, the organic layer OR2, the upper electrode UE2 and the cap layer CP2 are partly located on the partition 6 around subpixel SP2. These portions are spaced apart from, of the lower electrode LE2, the organic layer OR2, the upper electrode UE2 and the cap layer CP2, the portions located in the aperture AP2 (the portions constituting the display element DE2).

Similarly, the lower electrode LE3, the organic layer OR3, the upper electrode UE3 and the cap layer CP3 are partly located on the partition 6 around subpixel SP3. These portions are spaced apart from, of the lower electrode LE3, the organic layer OR3, the upper electrode UE3 and the cap layer CP3, the portions located in the aperture AP3 (the portions constituting the display element DE3).

The end portions of the sealing layers SE1, SE2 and SE3 are located above the partition 6. In the example of FIG. 3, the end portions of the sealing layers SE1 and SE2 located above the partition 6 between subpixels SP1 and SP2 are spaced apart from each other. The end portions of the sealing layers SE2 and SE3 located above the partition 6 between subpixels SP2 and SP3 are spaced apart from each other.

The sealing layers SE1, SE2 and SE3 are covered with a resin layer 14. The resin layer 14 is covered with a sealing layer 15. A resin layer may be further provided on the sealing layer 15.

Each of the sealing layers SE1, SE2 and SE3 and the sealing layer 15 is formed of, for example, an inorganic insulating material such as silicon nitride (Six). Each of the sealing layers SE1, SE2 and SE3 and the sealing layer 15 may be formed of another inorganic insulating material such as silicon oxide (SiOx), silicon oxynitride (SiON) or aluminum oxide ($Al_2O_3$).

The first rib layer 51 and the second rib layer 52 are formed of inorganic insulating materials different from each other. The first rib layer 51 is formed of a first inorganic insulating material such as silicon nitride (SiNx). The second rib layer 52 is formed of a second inorganic insulating material such as silicon oxide (SiOx) or silicon oxynitride (SiON).

The organic layer OR1 includes a light emitting layer EML1.

The organic layer OR2 includes a light emitting layer EML2.

The organic layer OR3 includes a light emitting layer EML3.

The light emitting layer EML1, the light emitting layer EML2 and the light emitting layer EML3 are formed of materials which are different from each other. For example, the light emitting layer EML1 is formed of a material which emits light in a blue wavelength range. The light emitting layer EML2 is formed of a material which emits light in a green wavelength range. The light emitting layer EML3 is formed of a material which emits light in a red wavelength range.

Each of the upper electrodes UE1, UE2 and UE3 is formed of, for example, a metal material such as an alloy of magnesium and silver (MgAg).

The lower portion 61 of the partition 6 is formed of, for example, aluminum (Al). The lower portion 61 may be formed of an aluminum alloy such as an aluminum-neodymium alloy (AlNd) or may comprise a multilayer structure consisting of an aluminum layer and an aluminum alloy layer. Further, the lower portion 61 may comprise a thin film formed of a metal material different from aluminum and an aluminum alloy under the aluminum layer or the aluminum alloy layer. This thin film can be formed of, for example, molybdenum (Mo), titanium nitride (TiN), a molybdenum tungsten alloy (MoW) or a molybdenum niobium alloy (MoNb).

For example, the upper portion 62 of the partition 6 comprises a multilayer structure consisting of a thin film formed of a metal material such as titanium (Ti) and a thin film formed of conductive oxide such as ITO. The upper portion 62 may comprise a single-layer structure of a metal material such as titanium.

Common voltage is applied to the partition 6. This common voltage is applied to each of the upper electrodes UE1, UE2 and UE3 which are in contact with the side surfaces of the lower portions 61.

Each of the base electrodes BE1, BE2 and BE3 is a metal electrode formed of a first metal material and does not include an oxide conductive layer formed of indium tin oxide (ITO), etc. The first metal material is aluminum or an aluminum alloy.

Each of the lower electrodes LE1, LE2 and LE3 is a metal electrode formed of a second metal material different from the first metal material and does not include an oxide conductive layer formed of ITO, etc. The second metal material is silver.

Thus, no oxide conductive layer is present immediately under the organic layer OR1 in the aperture AP1. The stacked layer body of the base and lower electrodes BE1 and LE1 formed of different types of metals functions as a reflecting electrode which reflects the light emitted from the light emitting layer EML1 of the organic layer OR1.

Similarly, no oxide conductive layer is present immediately under the organic layer OR2 in the aperture AP2. The stacked layer body of the base and lower electrodes BE2 and LE2 formed of different types of metals functions as a reflecting electrode which reflects the light emitted from the light emitting layer EML2 of the organic layer OR2.

Similarly, no oxide conductive layer is present immediately under the organic layer OR3 in the aperture AP3. The stacked layer body of the base and lower electrodes BE3 and LE3 formed of different types of metals functions as a reflecting electrode which reflects the light emitted from the light emitting layer EML3 of the organic layer OR3.

Thickness T1 of the lower electrode LE1 in the aperture AP1 (the distance parallel to the normal of the substrate 10 between the base electrode BE1 and the organic layer OR1), thickness T2 of the lower electrode LE2 in the aperture AP2 (the distance parallel to the normal of the substrate 10 between the base electrode BE2 and the organic layer OR2) and thickness T3 of the lower electrode LE3 in the aperture AP3 (the distance parallel to the normal of the substrate 10 between the base electrode BE3 and the organic layer OR3) are different from each other.

For example, thickness T2 is greater than thickness T1, and thickness T3 is greater than thickness T2. It should be noted that thickness T3 may be equal to thickness T2 (T1<T2≤T3).

In such a display device, when a potential difference is formed between the lower electrode LE1 and the upper electrode UE1, the light emitting layer EML1 of the organic layer OR1 emits light in a blue wavelength range.

When a potential difference is formed between the lower electrode LE2 and the upper electrode UE2, the light emitting layer EML2 of the organic layer OR2 emits light in a green wavelength range.

When a potential difference is formed between the lower electrode LE3 and the upper electrode UE3, the light emitting layer EML3 of the organic layer OR3 emits light in a red wavelength range.

Of the blue light emitted from the light emitting layer EML1, blue light which proceeds to the lower electrode LE1 is reflected on the reflecting electrode which is the stacked layer body of the base electrode BE1 and the lower electrode LE1. At this time, as no ITO layer is present between the organic layer OR1 and the reflecting electrode, undesired absorption of blue light by an ITO layer is prevented. In particular, the light absorption index of an ITO layer is high in a blue wavelength range. Therefore, the loss of blue light is large. Thus, the luminous efficiency can be improved. Here, the luminous efficiency corresponds to the luminance per unit current in the frontal direction of the display device DSP (current luminance efficiency).

Of the green light emitted from the light emitting layer EML2, green light which proceeds to the lower electrode LE2 is reflected on the reflecting electrode which is the stacked layer body of the base electrode BE2 and the lower electrode LE2. At this time, as no ITO layer is present between the organic layer OR2 and the reflecting electrode, undesired absorption of green light by an ITO layer is prevented.

Of the red light emitted from the light emitting layer EML3, red light which proceeds to the lower electrode LE3 is reflected on the reflecting electrode which is the stacked layer body of the base electrode BE3 and the lower electrode LE3. At this time, as no ITO layer is present between the organic layer OR3 and the reflecting electrode, undesired absorption of red light by an ITO layer is prevented.

Now, this specification explains the relationship between the thicknesses of the base and lower electrodes and the reflectance.

FIG. 4 is a diagram showing the simulation results of reflectance.

The horizontal axis indicates the wavelength (nm), and the vertical axis indicates the reflectance (%).

In the figure, R1 represents the result which is obtained when a silver layer is omitted and an aluminum layer having a thickness of 100 nm is located on an inorganic insulating layer.

In the figure, R2 represents the result which is obtained when a silver layer is omitted and an aluminum layer having a thickness of 50 nm is located on an inorganic insulating layer.

In the figure, R3 represents the result which is obtained when a silver layer is omitted and an aluminum layer having a thickness of 30 nm is located on an inorganic insulating layer.

In the figure, R4 represents the result which is obtained when an aluminum layer having a thickness of 50 nm is located on an inorganic insulating layer and a silver layer having a thickness of 10 nm is located on the aluminum layer.

In the figure, R5 represents the result which is obtained when an aluminum layer having a thickness of 50 nm is located on an inorganic insulating layer and a silver layer having a thickness of 20 nm is located on the aluminum layer.

In the figure, R6 represents the result which is obtained when an aluminum layer having a thickness of 50 nm is located on an inorganic insulating layer and a silver layer having a thickness of 30 nm is located on the aluminum layer.

In the figure, R7 represents the result which is obtained when an aluminum layer having a thickness of 50 nm is located on an inorganic insulating layer and a silver layer having a thickness of 40 nm is located on the aluminum layer.

In the figure, R8 represents the result which is obtained when an aluminum layer having a thickness of 50 nm is located on an inorganic insulating layer and a silver layer having a thickness of 50 nm is located on the aluminum layer.

In the figure, R9 represents the result which is obtained when a silver layer having a thickness of 100 nm is located on an inorganic insulating layer and an aluminum layer is omitted.

In the figure, R10 represents the result which is obtained when a silver layer having a thickness of 50 nm is located on an inorganic insulating layer and an aluminum layer is omitted.

It should be noted that the inorganic insulating layer used here is a silicon oxide layer. It is assumed that the surface of the aluminum layer or silver layer which is the top layer is in contact with air.

For example, the blue wavelength range of the light emitted from the light emitting layer EML1 is 450 nm to 470 nm. The center wavelength (peak) of the blue wavelength range is 460 nm.

The green wavelength range of the light emitted from the light emitting layer EML2 is 520 nm to 540 nm. The center wavelength (peak) of the green wavelength range is 530 nm.

The red wavelength range of the light emitted from the light emitting layer EML3 is 610 nm to 630 nm. The center wavelength (peak) of the red wavelength range is 620 nm.

When this specification focuses attention on an aluminum layer as a single layer, the following matters are confirmed. A high reflectance is obtained in a case where the thickness of the aluminum layer is 100 nm (R1) and a case where the thickness of the aluminum layer is 50 nm (R2) compared to a case where the thickness of the aluminum layer is 30 nm (R3). It is also confirmed that substantially an equal reflectance is obtained in a case where the thickness is greater than or equal to 50 nm. Thus, when an aluminum layer is applied as a base electrode, the thickness of the base electrode should be preferably greater than or equal to 50 nm.

When this specification focuses attention on a silver layer as a single layer, the following matters are confirmed. The reflectance in the blue wavelength range is low in a case where the thickness of the silver layer is 100 nm (R9) and a case where the thickness of the silver layer is 50 nm (R10).

When this specification focuses attention on the stacked layer body of an aluminum layer and a silver layer, the following matters are confirmed. A high reflectance is obtained in each of the blue wavelength range, the green wavelength range and the red wavelength range in all cases (R4 to R8) compared to the case of the single-layer body of an aluminum layer and the case of the single-layer body of a silver layer. Thus, when a stacked layer body of a base electrode (aluminum layer) and a lower electrode (silver layer) is applied as a reflecting electrode, the thickness of the lower electrode should be preferably greater than or equal to 10 nm.

Figure 5:
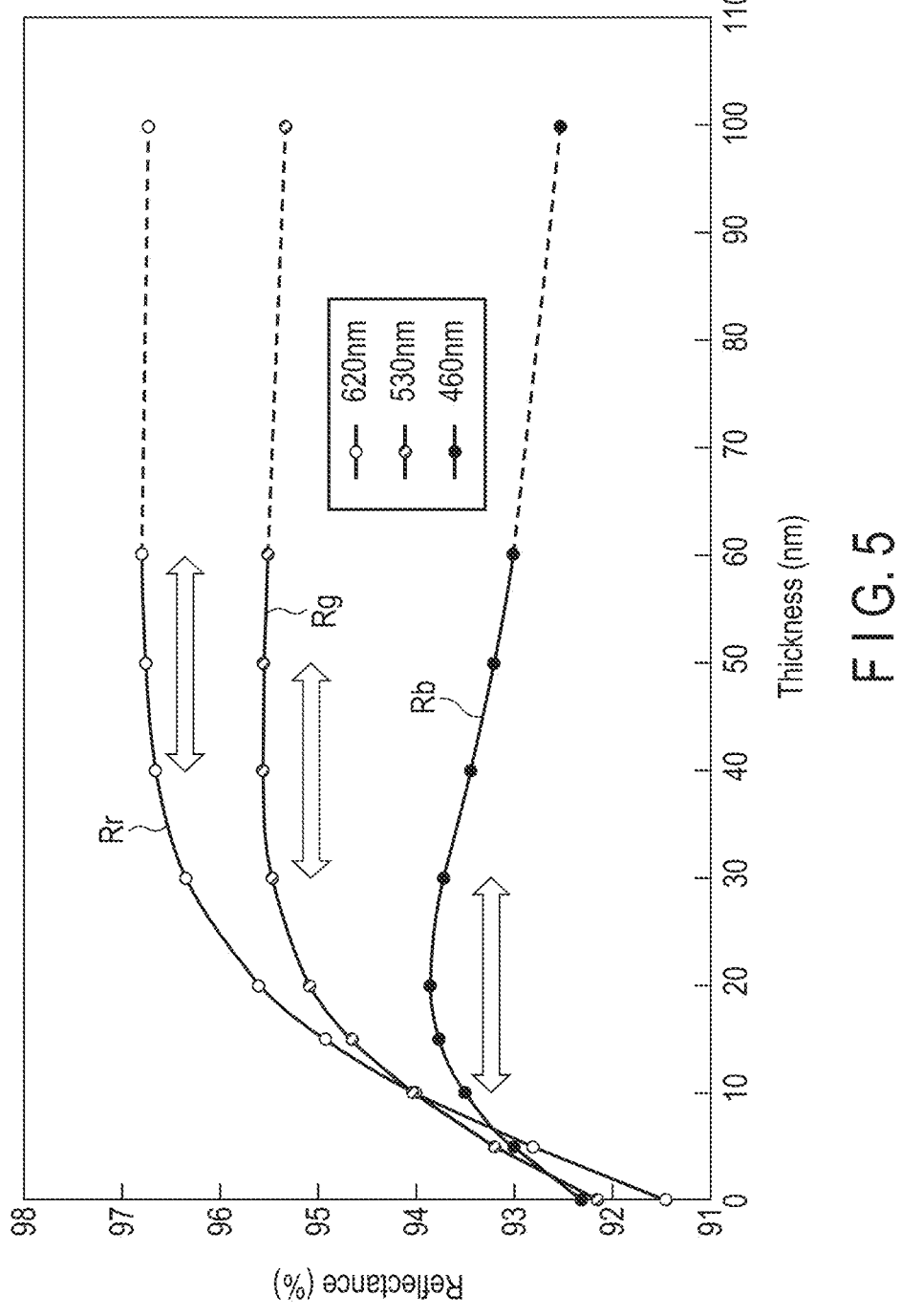
FIG. 5 is a diagram in which the results shown in FIG. 4 are summarized for each wavelength range.

FIG. 5 is a diagram in which the results shown in FIG. 4 are summarized for each wavelength range.

The horizontal axis indicates the thickness (nm) of a silver layer stacked on an aluminum layer having a thickness of 50 nm.

The vertical axis indicates the reflectance (%).

A case where the thickness of the horizontal axis is 0 nm corresponds to a case where a silver layer is omitted and an aluminum layer having a thickness of 50 nm is provided as a single layer. A case where the thickness of the horizontal axis is 100 nm corresponds to a case where an aluminum layer is omitted and a silver layer having a thickness of 100 nm is provided as a single layer.

When this specification focuses attention on reflectance Rb of the center wavelength (460 nm) of the blue wavelength range, it is confirmed that a high reflectance is obtained in a range in which the thickness of the silver layer is greater than or equal to 10 nm but less than or equal to 30 nm. In the stacked layer body of the base electrode (aluminum layer) BE1 and the lower electrode (silver layer) LE1, the thickness of the lower electrode LE1 is less than that of the base electrode BE1.

When this specification focuses attention on reflectance Rg of the center wavelength (530 nm) of the green wavelength range, it is confirmed that a high reflectance is obtained in a range in which the thickness of the silver layer is greater than or equal to 30 nm. To improve the efficiency of the manufacturing process, the thickness of the silver layer should be preferably less than or equal to 50 nm. In the stacked layer body of the base electrode (aluminum layer) BE2 and the lower electrode (silver layer) LE2, the thickness of the lower electrode LE2 is equal to that of the base electrode BE2 or less than that of the base electrode BE2.

When this specification focuses attention on reflectance Rr of the center wavelength (620 nm) of the red wavelength range, it is confirmed that a high reflectance is obtained in a range in which the thickness of the silver layer is greater than or equal to 40 nm. To improve the efficiency of the manufacturing process, the thickness of the silver layer should be preferably less than or equal to 60 nm.

Figure 6:
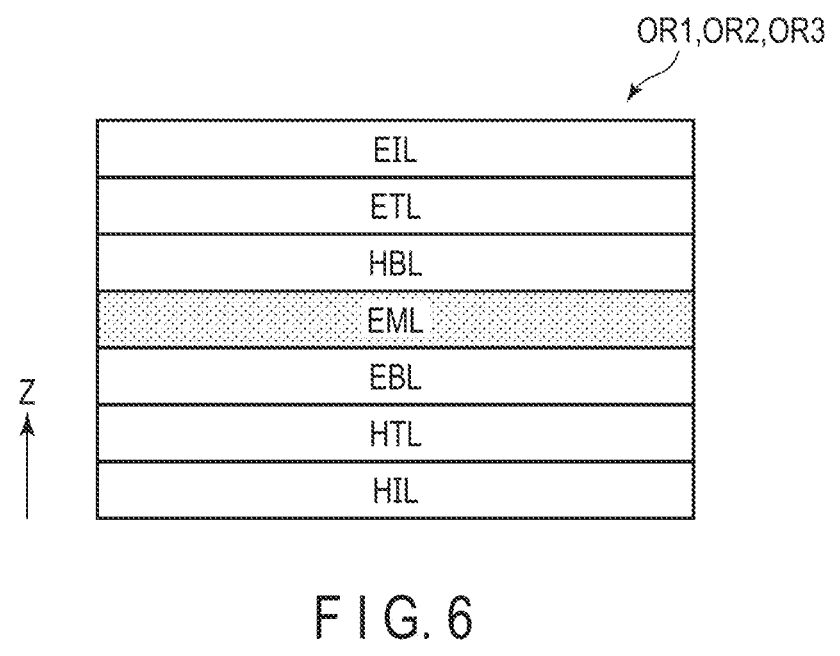

FIG. 6 is a diagram showing an example of a layer structure which could be applied to the organic layers OR1, OR2 and OR3.

Each of the organic layers OR1, OR2 and OR3 comprises, for example, a structure in which a hole injection layer HIL, a hole transport layer HTL, an electron blocking layer EBL, a light emitting layer EML, a hole blocking layer HBL, an electron transport layer ETL and an electron injection layer EIL are stacked in order in a third direction Z. Each of the organic layers OR1, OR2 and OR3 may comprise a tandem structure including a plurality of light emitting layers EML.

To improve the light extraction efficiency of the display elements DE1, DE2 and DE3, the thicknesses of the organic layers OR1, OR2 and OR3 should be preferably adjusted based on the wavelengths of the light emitted from the light emitting layers EML. For example, thickness T11 of the organic layer OR1, thickness T12 of the organic layer OR2 and thickness T13 of the organic layer OR3 shown in FIG. 3 are different from each other. Specifically, thickness T12 is greater than thickness T11, and thickness T13 is greater than thickness T12 (T11<T12<T13). This difference in thicknesses T11, T12 and T13 is generated as, for example, the thicknesses of the hole transport layers HTL of the organic layers OR1, OR2 and OR3 are different from each other. However, the configuration is not limited to this example.

Figure 7:
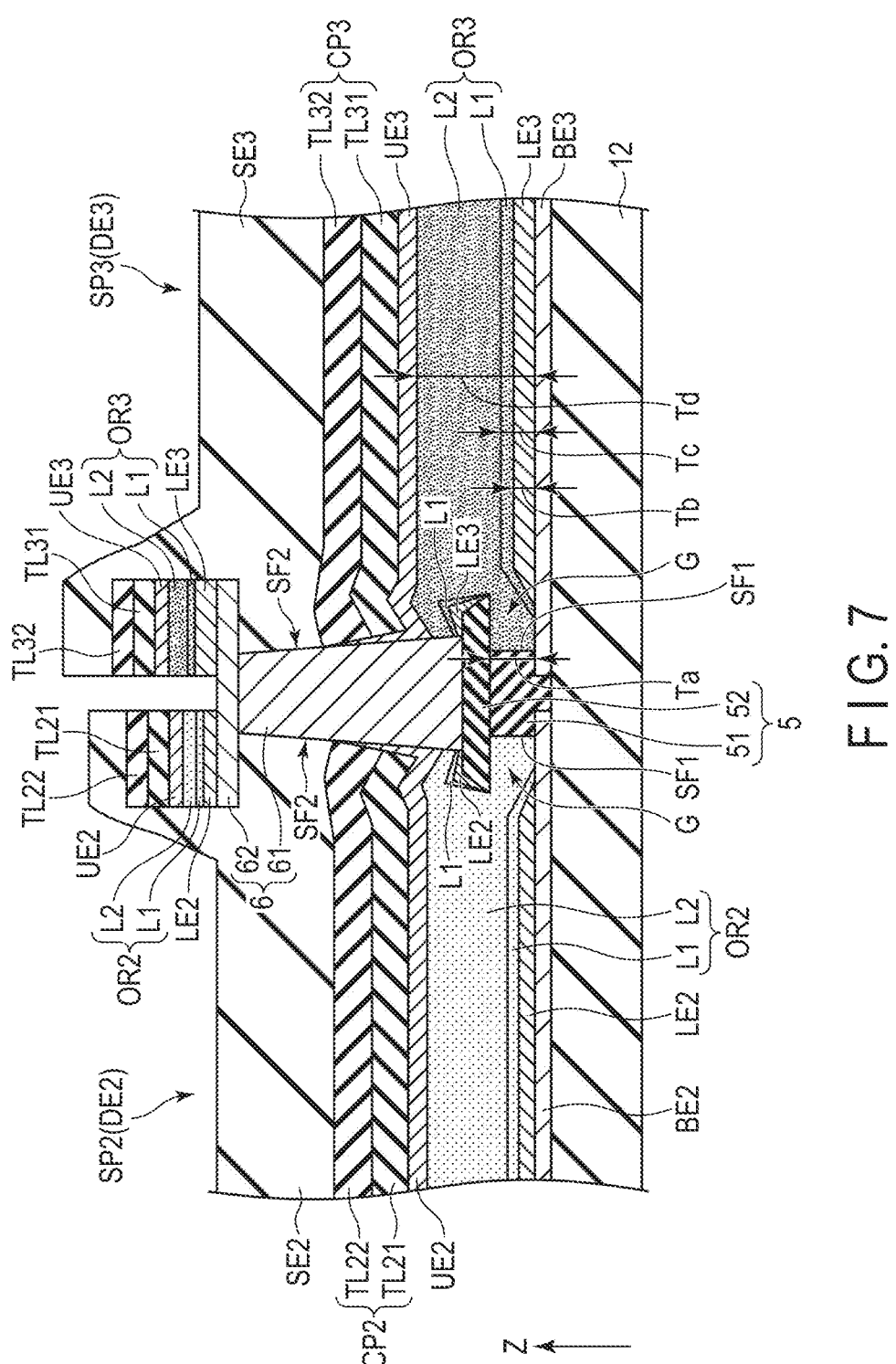
FIG. 7 is a schematic cross-sectional view in which a partition 6 between subpixels SP2 and SP3 and its vicinity are enlarged.

FIG. 7 is a schematic cross-sectional view in which the partition 6 between subpixels SP2 and SP3 and its vicinity are enlarged. In FIG. 7, the illustrations of the resin layer 14 and the sealing layer 15 are omitted.

Here, this specification focuses attention on the second rib layer 52 provided between the first rib layer 51 and the lower portion 61 of the partition 6. The first rib layer 51 comprises a pair of side surfaces SF1. The lower portion 61 comprises a pair of side surfaces SF2.

In a section orthogonal to the extension direction of the partition 6, the width of the second rib layer 52 is greater than that of the first rib layer 51 and is greater than that of the lower portion 61. Here, the width of the lower portion 61 corresponds to the width of, of the lower portion 61, the lower surface facing the second rib layer 52. In the example shown in the figure, the width of the lower portion 61 is greater than that of the first rib layer 51. However, in some cases, the width of the lower portion 61 is less than that of the first rib layer 51.

Thus, the second rib layer 52 protrudes from each side surface SF1 of the first rib layer 51. The widths of the second rib layers 52 protruding from the first rib layer 51 are substantially equal to each other on the both sides of the first rib layer 51.

The second rib layer 52 protrudes from each side surface SF2 of the lower portion 61. The widths of the second rib layers 52 protruding from the lower portion 61 are substantially equal to each other on the both sides of the lower portion 61.

In the partition 6, the upper portion 62 protrudes from each side surface SF2 of the lower portion 61. The widths of the upper portions 61 protruding from the lower portion 61 are substantially equal to each other on the both sides of the lower portion 61.

The thickness of the lower electrode LE3 decreases toward the lower portion 61 immediately under the upper portion 62. In the example shown in the figure, the end portion of the lower electrode LE3 is spaced apart from the rib 5. As the first rib layer 51 is an inorganic insulating layer, the end portion of the lower electrode LE3 may be in contact with the first rib layer 51.

The organic layer OR3 covers the entire lower electrode LE3.

The organic layer OR3 comprises a first layer L1 which is in contact with the lower electrode LE3 and a second layer L2 which covers the first layer L1. Of the layers shown in FIG. 6, at least the hole injection layer HIL is included in the first layer L1, and the layers which are not included in the first layer L1 are included in the second layer L2. For example, the first layer L1 consists of the hole injection layer HIL, and the second layer L2 consists of the hole transport layer HTL, the electron blocking layer EBL, the light emitting layer EML, the hole blocking layer HBL, the electron transport layer ETL and the electron injection layer EIL.

The organic layer OR3 is in contact with the rib 5 and the partition 6. A gap G surrounded by the first rib layer 51, the second rib layer 52 and the base electrode BE3 is blocked by the organic layer OR3. It should be noted that the gap G may not be completely filled with the organic layer OR3.

In the example of FIG. 7, while the second layer L2 is in contact with the lower portion 61, the first layer L1 is not in contact with the lower portion 61. This configuration prevents undesired current leakage via the hole injection layer HIL included in the first layer L1.

In the example of FIG. 7, each of the lower electrode LE3 and the first layer L1 is partly located on the second rib layer 52. These portions are spaced apart from, of the lower electrode LE3 and the first layer L1, the portions located on the base electrode BE3 (in other words, the portions constituting the display element DE3).

For example, the second layer L2 covers the lower electrode LE3 and first layer L1 located on the second rib layer 52 without being interrupted by the gap G. The second layer L2 may be in contact with the side surface SF2 or may be spaced apart from the side surface SF2.

The upper electrode UE3 entirely covers the second layer L2 of the organic layer OR3. Further, the upper electrode UE3 is in contact with the side surface SF2 of the lower portion 61. Thus, the upper electrode UE3 is electrically connected to the lower portion 61.

Of the side surface SF2 facing subpixel SP3, the area which is not covered with the upper electrode UE3 is covered with the sealing layer SE3. The sealing layer SE3 covers the lower surface of the upper portion 62 and also continuously covers the stacked layer body of the lower electrode LE3, the first and second layers L1 and L2 of the organic layer OR3, the upper electrode UE3, the transparent layer TL31 and the transparent layer TL32 provided on the upper portion 62.

To avoid a short circuit with the upper electrode UE3, the lower electrode LE3 needs to be spaced apart from the lower portion 61. In consideration of this matter, thickness Ta of the first rib layer 51 which overlaps the base electrode BE3 (or the height of the gap G from the base electrode BE3 to the second rib layer 52) should be preferably greater than thickness Tb of the lower electrode LE3 which overlaps the base electrode BE3 (corresponding to thickness T3 shown in FIG. 3) (Ta>Tb).

In this configuration, the lower electrode LE3 does not easily climb over the gap G, thereby preventing the contact between the lower electrode LE3 and the lower portion 61. For example, thickness Ta is 60 nm, and thickness Tb is 40 nm. The depth of the gap G, in other words, the protrusion length of the second rib layer 52 from the side surface SF1 is, for example, equal to thickness Ta.

As explained with reference to FIG. 3, each of thickness T1 of the lower electrode LE1 and thickness T2 of the lower electrode LE2 is less than thickness T3 of the lower electrode LE3. Thus, thickness Ta is greater than thickness T1 and is greater than thickness T2 (Ta>T1, Ta>T2).

The hole injection layer HIL of the organic layer OR3 also needs to be spaced apart from the lower portion 61 to prevent current leakage as explained above. Thus, thickness Ta should be preferably greater than total thickness Tc of the lower electrode LE3 and the hole injection layer HIL (or the total thickness of the lower electrode LE3 and the first layer L1) (Ta>Tc). By this configuration, the contact between the hole injection layer HIL and the lower portion 61 can be prevented.

To the contrary, the upper electrode UE3 needs to be in contact with the lower portion 61 to be electrically connected to the lower portion 61 in an assured manner. Thus, thickness Ta should be preferably less than total thickness Td of the lower electrode LE3 and the organic layer OR3 (Ta<Td). By this configuration, the gap G is easily blocked by the organic layer OR3. When the gap G is blocked by the organic layer OR3, the upper electrode UE3 located on the organic layer OR3 is in contact with the side surface SF2 without interruption by the gap G.

Each of thicknesses Tb, Tc and Td is, for example, the average thickness of the portion excluding the vicinity of the end portion whose thickness is decreased from the lower electrode LE3 and the organic layer OR3.

The configuration of the base electrode BE2, the lower electrode LE2, the organic layer OR2, the upper electrode UE2, the cap layer CP2 and the sealing layer SE2 shown in FIG. 7 is similar to that of the base electrode BE3, the lower electrode LE3, the organic layer OR3, the upper electrode UE3, the cap layer CP3 and the sealing layer SE3. The configuration of the base electrode BE1, the lower electrode LE1, the organic layer OR1, the upper electrode UE1, the cap layer CP1 and the sealing layer SE1 is also similar to that of the base electrode BE3, the lower electrode LE3, the organic layer OR3, the upper electrode UE3, the cap layer CP3 and the sealing layer SE3.

Now, this specification explains the manufacturing method of the display device DSP.

FIG. 8 is a flowchart showing an example of the manufacturing method of the display device DSP. Each of FIG. 9 to FIG. 20 is a schematic cross-sectional view showing part of the manufacturing process of the display device DSP. In FIG. 11 to FIG. 20, the substrate 10 and the circuit layer 11 are omitted.

To manufacture the display device DSP, first, the circuit layer 11 and the insulating layer 12 are formed on the substrate 10 (process P1).

Figure 9:
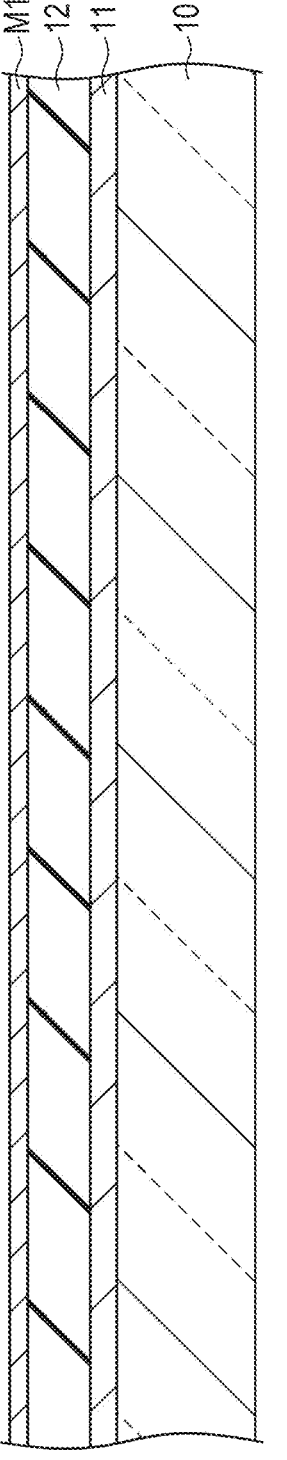
FIG. 9 is a schematic cross-sectional view showing the manufacturing process of the display device DSP.

Subsequently, the base electrodes BE1, BE2 and BE3 are formed on the insulating layer 12 (process P2). Specifically, as shown in FIG. 9, a metal layer M1 is formed on the insulating layer 12 by using the first metal material. The first metal material is, for example, aluminum. However, the first metal material may be an aluminum alloy.

Figure 10:
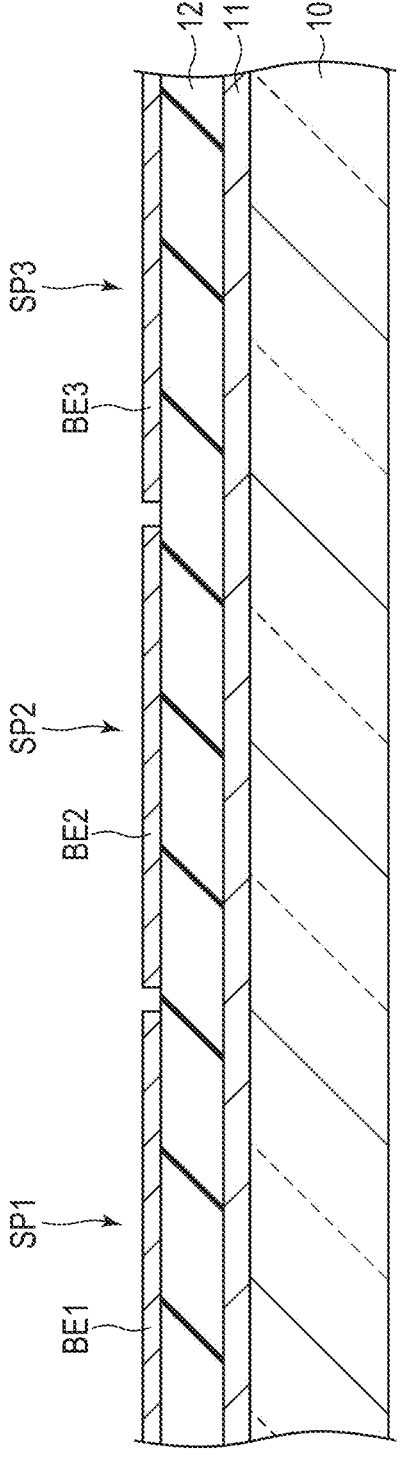
FIG. 10 is a schematic cross-sectional view showing a manufacturing process following FIG. 9.

Subsequently, as shown in FIG. 10, the metal layer M1 is patterned to form the base electrodes BE1, BE2 and BE3 which are spaced apart from each other. The base electrode BE1 is located in subpixel SP1. The base electrode BE2 is located in subpixel SP2. The base electrode BE3 is located in subpixel SP3. Here, the patterning includes the process of forming a resist having a predetermined shape on the metal layer M1, the process of removing part of the metal layer M1 by dry etching using the resist as a mask and the process of removing the resist.

Subsequently, the partition 6 is formed (process P3). The apertures AP1, AP2 and AP3 of the rib 5 are formed (process P4). The specific process is as follows.

First, as shown in FIG. 11, a first insulating layer IL1 is formed so as to cover the insulating layer 12 and the base electrodes BE1, BE2 and BE3. The first insulating layer IL1 is formed of silicon nitride (SiN) as an example of the first inorganic insulating material by, for example, chemical vapor deposition (CVD).

Subsequently, a second insulating layer IL2 is formed on the first insulating layer IL'. The second insulating layer IL2 is formed of silicon oxynitride (SiON) as an example of the second inorganic insulating material by, for example, CVD. However, the second insulating layer IL2 may be formed of silicon oxide.

Figure 12:
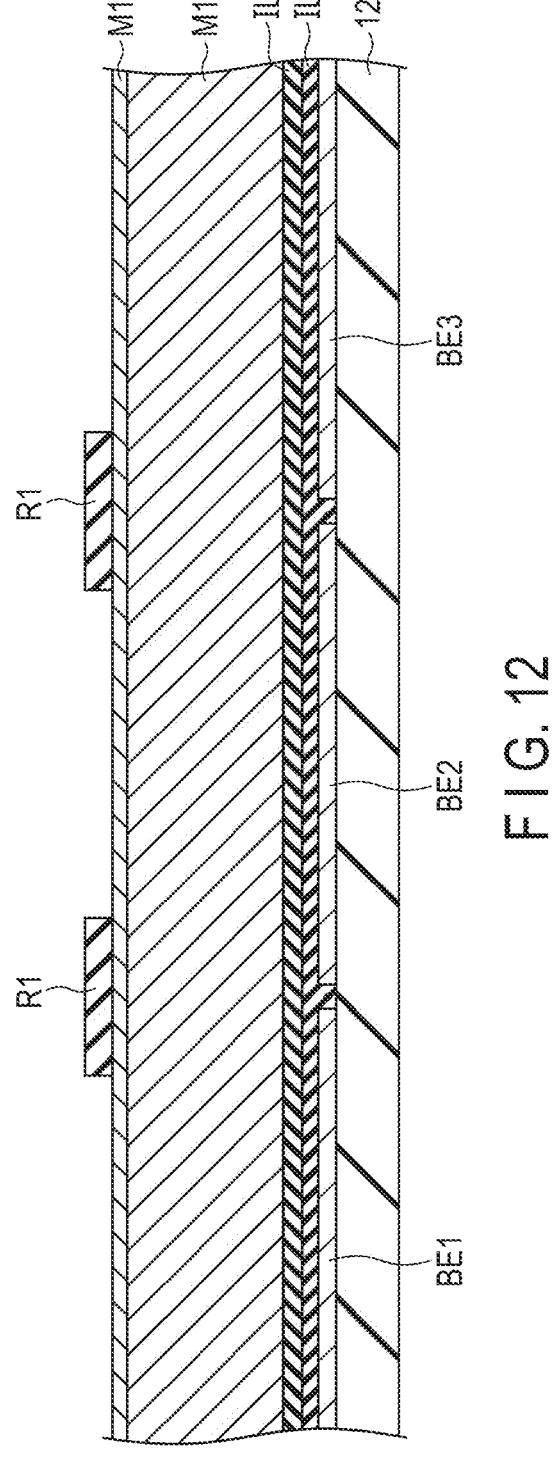
FIG. 12 is a schematic cross-sectional view showing a manufacturing process following FIG. 11.

Subsequently, as shown in FIG. 12, a metal layer M11 which is the base of the lower portion 61 is formed on the second insulating layer IL2, and a thin film M12 which is the base of the upper portion 62 is formed on the metal layer M11. Further, a resist R1 based on the shape of the partition 6 is formed on the thin film M12.

Subsequently, as shown in FIG. 13, of the thin film M12, the portion exposed from the resist R1 is removed by wet etching. By this process, the upper portion 62 is formed.

Figure 14:
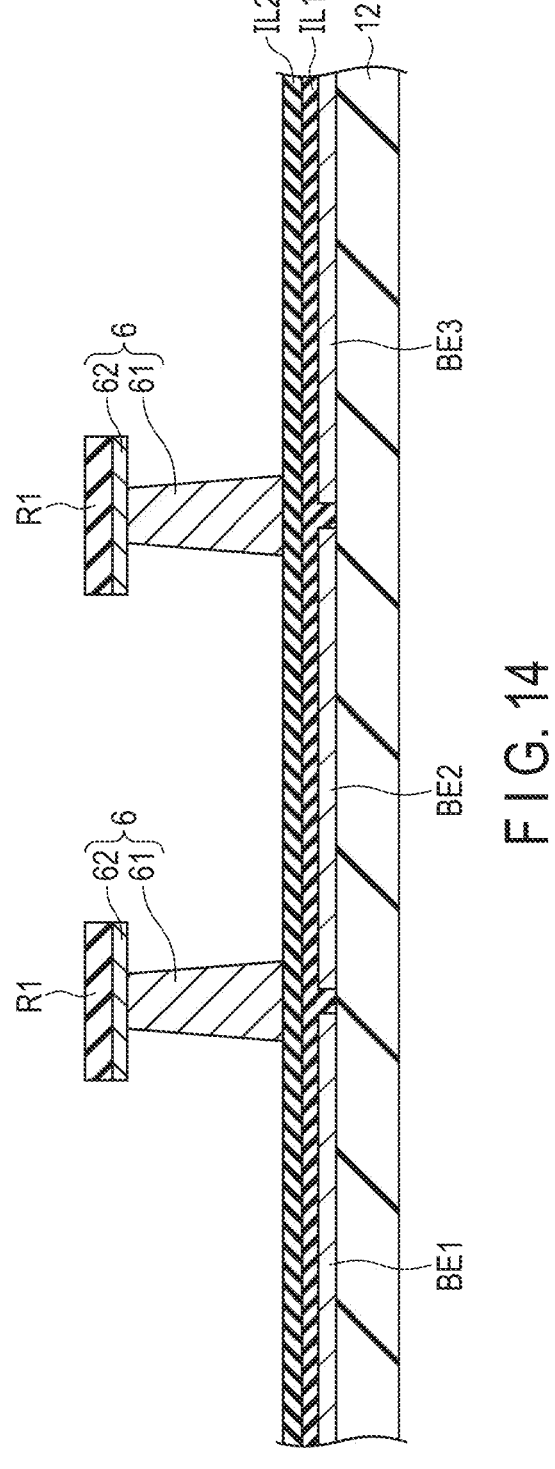
FIG. 14 is a schematic cross-sectional view showing a manufacturing process following FIG. 13.

Subsequently, as shown in FIG. 14, anisotropic dry etching and isotropic wet etching are performed to remove, of the metal layer M11, the portion exposed from the resist R1. By this process, the lower portion 61 is formed. Subsequently, the resist R1 is removed.

After process P3, the first insulating layer IL1 and the second insulating layer IL2 are patterned. Specifically, first, as shown in FIG. 15, anisotropic dry etching is performed to remove, of the second insulating layer IL2, the portion exposed from the lower portion 61. In this dry etching, the upper portion 62 functions as a mask. Thus, of the second insulating layer IL2, the portion located under the upper portion 62 remains. By this process, the second rib layer 52 having a width greater than that of the lower portion 61 is formed.

As another example, after forming a resist which individually covers the partition 6, anisotropic dry etching may be performed to remove, of the second insulating layer IL2, the portion exposed from the resist. Subsequently, the resist may be removed to form the second rib layer 52.

Subsequently, as shown in FIG. 16, the aperture AP1 which overlaps the base electrode BE1, the aperture AP2 which overlaps the base electrode BE2 and the aperture AP3 which overlaps the base electrode BE3 are formed. For example, isotropic dry etching is performed to remove, of the first insulating layer IL', the portion exposed from the second rib layer 52. Further, in this dry etching, the side etching of the first insulating layer IL1 located immediately under the second rib layer 52 proceeds, and thus, the width of the first insulating layer IL1 is made less than that of the second rib layer 52. By this process, the first rib layer 51 comprising the apertures AP1, AP2 and AP3 and having a width less than that of the second rib layer 52 is formed.

To prevent the corrosion of the second rib layer 52 in the isotropic dry etching of FIG. 16, the second rib layer 52 should be preferably formed of a material in which the etching rate in the dry etching is slower than that of the first rib layer 51 (first insulating layer IL1). For example, as described above, when the second rib layer 52 is formed of silicon oxide or silicon oxynitride, and the first rib layer 51 is formed of silicon nitride, this relationship of the etching rates is realized.

It should be noted that the partition 6 may be formed after the formation of the apertures AP1, AP2 and AP3 of the rib 5.

Figure 17:
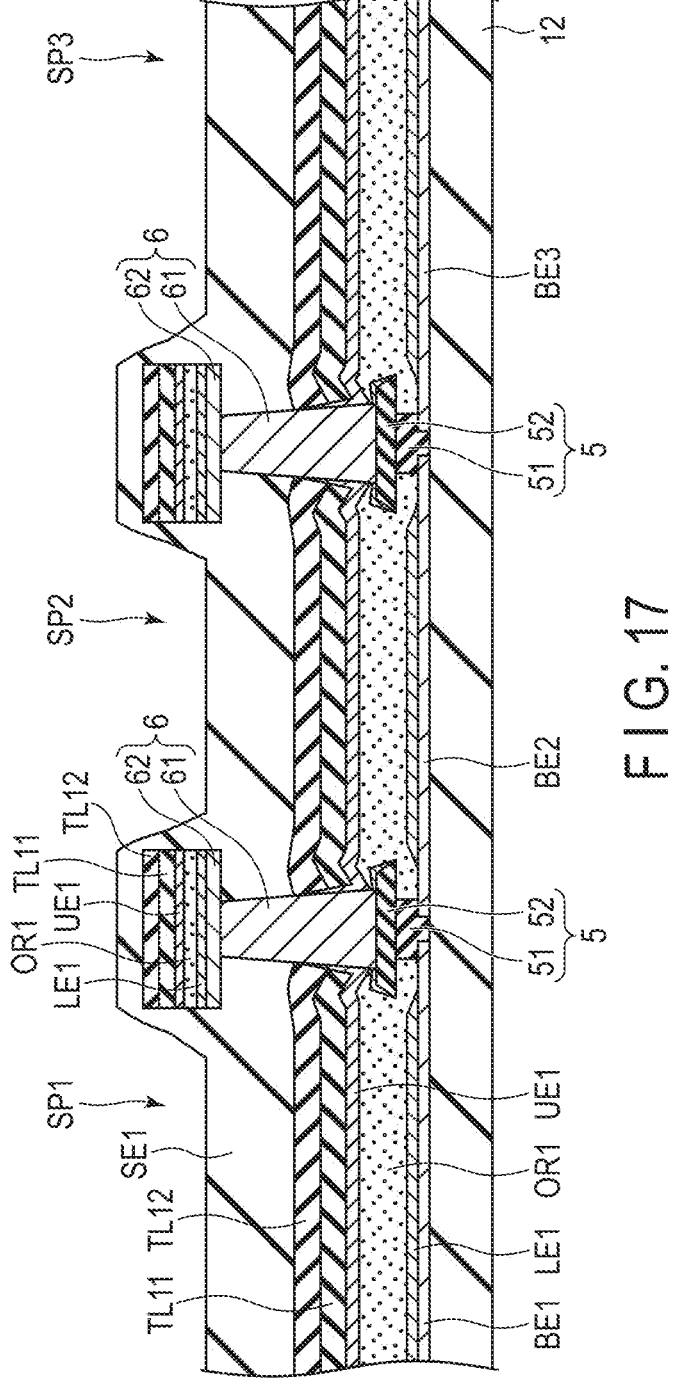
FIG. 17 is a schematic cross-sectional view showing a manufacturing process following FIG. 16.

After process P4, the display element DE1 is formed (process P5). Specifically, as shown in FIG. 17, the lower electrode LE1 is formed by depositing the second metal material on the base electrodes BE1, BE2 and BE3 and the partition 6 (process P11). The second metal material is silver.

Subsequently, the organic layer OR1 is formed by depositing the materials for forming the hole injection layer, the hole transport layer, the electron blocking layer, the light emitting layer, the hole blocking layer, the electron transport layer, the electron injection layer, etc., on the lower electrode LE1 in series (process P12).

Subsequently, the upper electrode UE1 is formed by depositing a mixture of magnesium and silver on the organic layer OR1 (process P13).

Subsequently, the transparent layer TL11 is formed by depositing a high-refractive material on the upper electrode UE1. Further, the transparent layer TL12 is formed by depositing a low-refractive material on the transparent layer TL11. In this manner, the cap layer CP1 is formed (process P14). Further, the sealing layer SE1 is formed so as to cover the transparent layer TL12 and the partition 6 (process P15). The sealing layer SE1 is formed of silicon nitride (SiN) by CVD.

The lower electrode LE1, the organic layer OR1, the upper electrode UE1, the transparent layer TL11, the transparent layer TL12 and the sealing layer SE1 are formed in at least the entire display area DA and are provided in subpixels SP2 and SP3 as well as subpixel SP1. The lower electrode LE1, the organic layer OR1, the upper electrode UE1, the transparent layer TL11 and the transparent layer TL12 are divided by the partition 6 having an overhang shape. The lower electrode LE1 is spaced apart from the lower portion 61. The upper electrode UE1 is in contact with the side surface of the lower portion 61. The sealing layer SE1 continuously covers the display element DE1 including the lower electrode LE1, the organic layer OR1, the upper electrode UE1, the transparent layer TL11 and the transparent layer TL12 and the partition 6.

When each of the lower electrode LE1, the organic layer OR1, the upper electrode UE1, the transparent layer TL11 and the transparent layer TL12 is formed by vapor deposition, the material emitted from an evaporation source is blocked by the upper portion 62. Thus, each of the lower electrode LE1, the organic layer OR1, the upper electrode UE1, the transparent layer TL11 and the transparent layer TL12 is partly stacked on the upper portion 62.

At least processes P11 and P12, preferably processes P11 to P15, are successively performed in a vacuum environment. In other words, at least from the start of process P11 until the completion of process P12, the circumference of the substrate which is the target of these processes is continuously maintained as a vacuum. Thus, the lower electrode LE1 formed in process P11 is covered with the lowest layer (for example, the hole injection layer HIL) of the organic layer OR1 in process P12 without being in contact with the atmosphere.

After process P15, as shown in FIG. 18, a resist R11 is provided on the sealing layer SE1 (process P16). The resist R11 covers subpixel SP1 and part of the partition 6 around the subpixel. Subsequently, the sealing layer SE1, the transparent layer TL12, the transparent layer TL11, the upper electrode UE1, the organic layer OR1 and the lower electrode LE1 are patterned in series using the resist R11 as a mask (process P17). This patterning process includes dry etching and wet etching for removing, of the sealing layer SE1, the transparent layer TL12, the transparent layer TL11, the upper electrode UE1, the organic layer OR1 and the lower electrode LE1, the portions exposed from the resist R11 in series.

After process P17, the resist R11 is removed by an exfoliation liquid, and the residue of the resist R11, etc., is removed by asking (process P18). By this process, the display element DE1 and the sealing layer SE1 are formed in subpixel SP1, and the base electrode BE2 of subpixel SP2 and the base electrode BE3 of subpixel SP3 are exposed.

Figure 19:
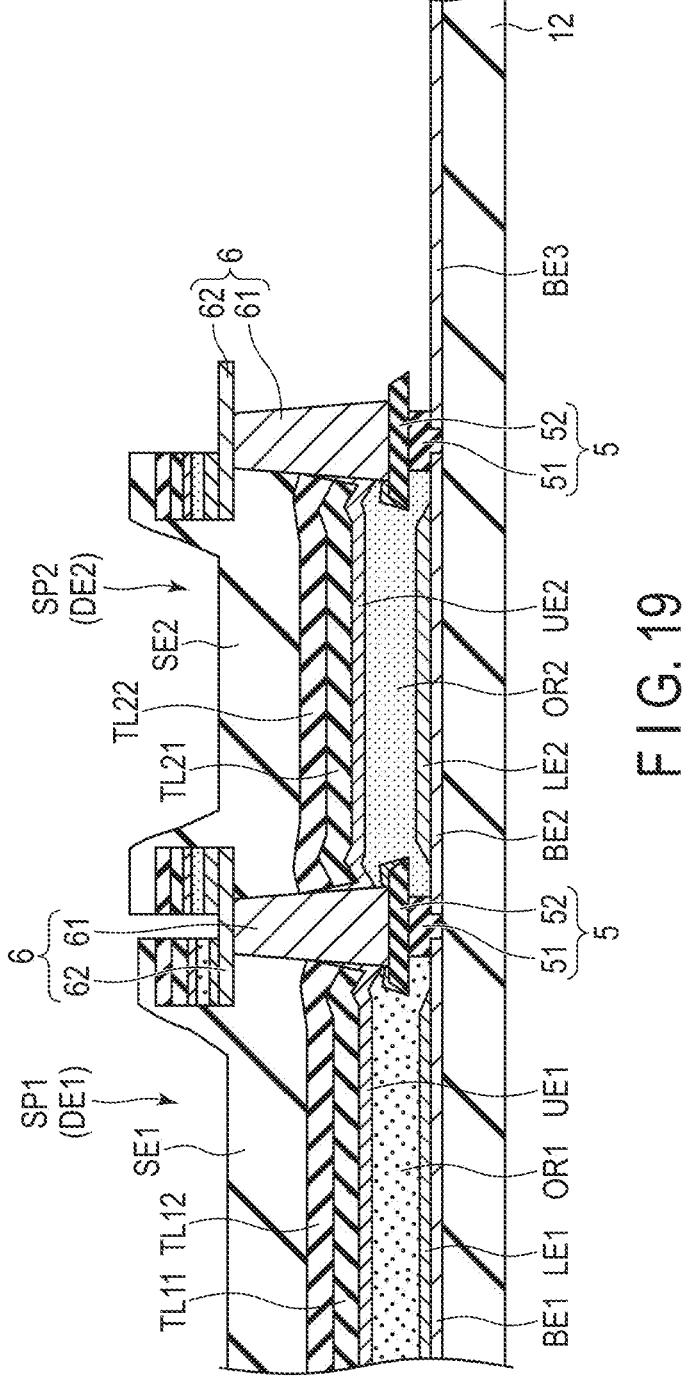
FIG. 19 is a schematic cross-sectional view showing a manufacturing process following FIG. 18.

After the formation of the display element DE1, as shown in FIG. 19, the display element DE2 is formed (process P6). The procedure of forming the display element DE2 is similar to processes P11 to P18. Specifically, in a manner similar to that of processes P11 to P15, the lower electrode LE2, the organic layer OR2, the upper electrode UE2, the transparent layer TL21 and the transparent layer TL22 are formed in order by vapor deposition on the base electrode BE2, and the sealing layer SE2 is formed by CVD. At least the lower electrode LE2 and the organic layer OR2 are successively formed in a vacuum environment. Thus, the lower electrode LE2 is covered with the organic layer OR2 without being in contact with the atmosphere.

Subsequently, a resist is provided on the sealing layer SE2 in a manner similar to that of process P16. Subsequently, the sealing layer SE2, the transparent layer TL22, the transparent layer TL21, the upper electrode UE2, the organic layer OR2 and the lower electrode LE2 are patterned in series in a manner similar to that of process P17. After this patterning, the resist is removed in a manner similar to that of process P18.

Through the above process, the display element DE2 and the sealing layer SE2 are formed in subpixel SP2, and the base electrode BE3 of subpixel SP3 is exposed.

After the formation of the display element DE2, as shown in FIG. 20, the display element DE3 is formed (process P7). The procedure of forming the display element DE3 is similar to processes P11 to P18. Specifically, in a manner similar to that of processes P11 to P15, the lower electrode LE3, the organic layer OR3, the upper electrode UE3, the transparent layer TL31 and the transparent layer TL32 are formed in order by vapor deposition on the base electrode BE3, and the sealing layer SE3 is formed by CVD. At least the lower electrode LE3 and the organic layer OR3 are successively formed in a vacuum environment. Thus, the lower electrode LE3 is covered with the organic layer OR3 without being in contact with the atmosphere.

Subsequently, a resist is provided on the sealing layer SE3 in a manner similar to that of process P16. Subsequently, the sealing layer SE3, the transparent layer TL32, the transparent layer TL31, the upper electrode UE3, the organic layer OR3 and the lower electrode LE3 are patterned in series in a manner similar to that of process P17. After this patterning, the resist is removed in a manner similar to that of process P18.

Through the above process, the display element DE3 and the sealing layer SE3 are formed in subpixel SP3.

After process P7, the resin layer 14 and sealing layer 15 shown in FIG. 3 are formed in order (process P8). By this process, the display device DSP is completed. In the manufacturing process described above, this specification assumes a case where the display element DE1 is formed firstly, and the display element DE2 is formed secondly, and the display element DE3 is formed lastly. However, the formation order of the display elements DE1, DE2 and DE3 is not limited to this example.

According to the present embodiment, the lower electrode LE1 and the organic layer OR1 are formed by continuous vapor deposition in a vacuum environment. The lower electrode LE2 and the organic layer OR2 and the lower electrode LE3 and the organic layer OR3 are also formed by continuous vapor deposition in a vacuum environment. In this case, the surface of the lower electrode LE1, LE2 or LE3 is not exposed to the atmosphere or a chemical. Thus, the damage to the lower electrodes LE1, LE2 and LE3 is reduced, and the reduction in the reflectance as reflecting electrodes is prevented.

In addition, the absorption of the light emitted from the organic layers OR1, OR2 and OR3 is prevented by omitting an ITO layer between the lower electrode LE1 and the organic layer OR1, between the lower electrode LE2 and the organic layer OR2 and between the lower electrode LE3 and the organic layer OR3. Further, as the deterioration of the upper surfaces of the lower electrodes LE1, LE2 and LE3 is prevented, a good hole injection property can be assured.

Thus, the luminous efficiency of the display elements DE1, DE2 and DE3 is improved.

Moreover, in the present embodiment, the rib 5 provided immediately under the partition 6 comprises the first rib layer 51, and the second rib layer 52 provided between the first rib layer 51 and the partition 6. The second rib layer 52 protrudes from each side surface SF1 of the first rib layer 51 and protrudes from each side surface SF2 of the lower portion 61 of the partition 6. This configuration prevents the lower electrodes LE1, LE2 and LE3 from contacting the lower portion 61. Even if the materials of the lower electrodes LE1, LE2 and LE3 are attached to the side surfaces SF2 of the lower portion 61 at the time of the vapor deposition of the lower electrodes LE1, LE2 and LE3, the portions to which the materials are attached are divided by the gap G from the lower electrodes LE1, LE2 and LE3 which are in contact with the base electrodes BE1, BE2 and BE3, respectively. Thus, a short circuit between the lower electrodes LE1, LE2 and LE3 and the lower portion 61 can be assuredly prevented. In addition, as the lower electrodes LE1, LE2 and LE3 can be made close to the lower portion 61 even while preventing the short circuit, large areas can be assured for the display elements DE1, DE2 and DE3 (light emission regions).

Now, another configuration example is explained.

Figure 21:
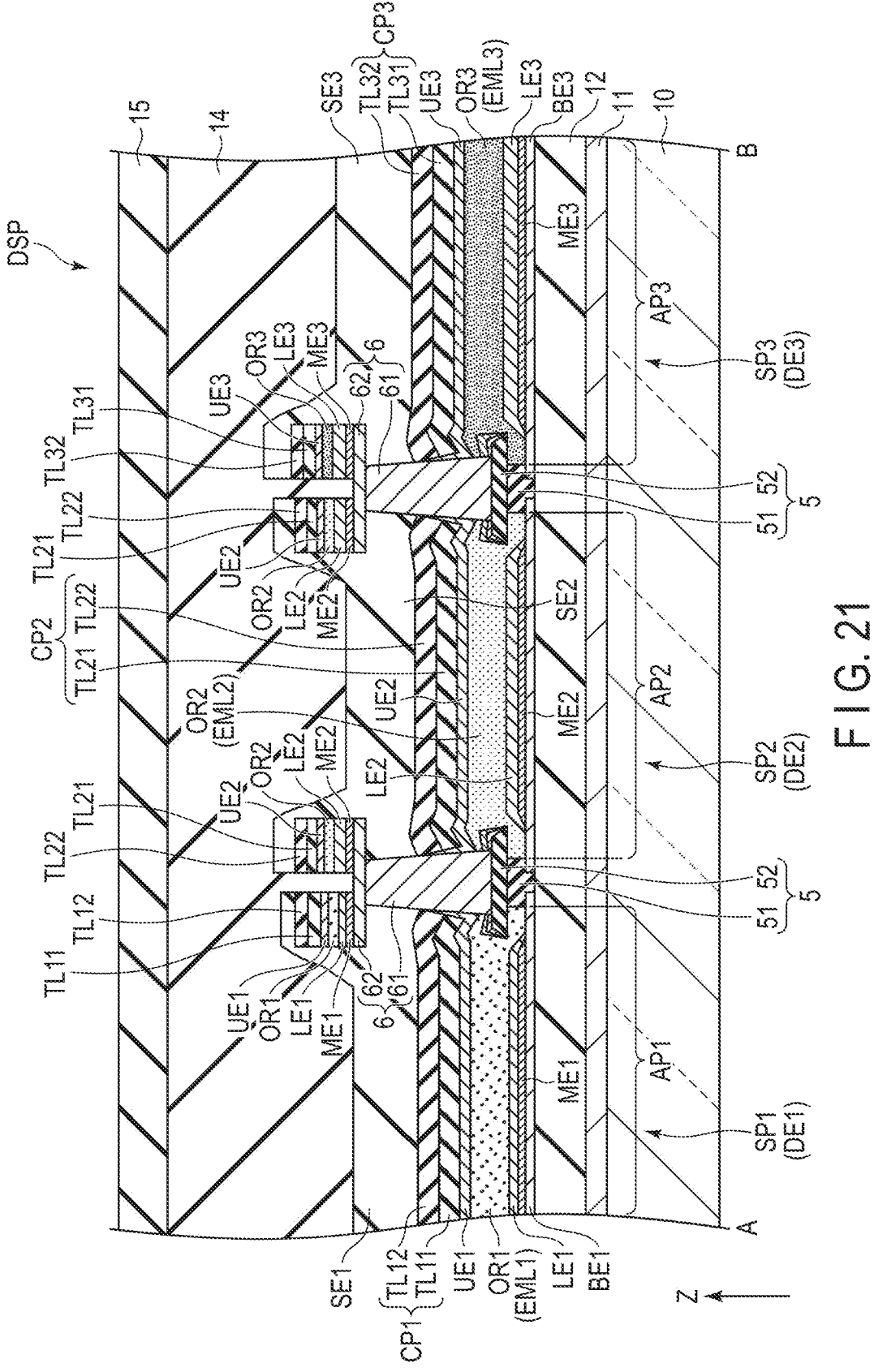
FIG. 21 is a cross-sectional view showing another configuration example of the display device DSP.

FIG. 21 is a cross-sectional view showing another configuration example of the display device DSP.

The configuration example shown in FIG. 21 is different from the configuration example shown in FIG. 3 in the following respects. An intermediate electrode ME1 is interposed between the base electrode BE1 and the lower electrode LE1. An intermediate electrode ME2 is interposed between the base electrode BE2 and the lower electrode LE2. An intermediate electrode ME3 is interposed between the base electrode BE3 and the lower electrode LE3. Hereinafter, basically, the main differences are explained.

In the display element DE1, the intermediate electrode ME1 overlaps the base electrode BE1. The lower electrode LE1 overlaps the intermediate electrode ME1. The organic layer OR1 covers a stacked layer body of the base electrode BE1, the intermediate electrode ME1 and the lower electrode LE1. The upper electrode UE1 covers the organic layer OR1 and is in contact with the lower portion 61.

In the display element DE2, the intermediate electrode ME2 overlaps the base electrode BE2. The lower electrode LE2 overlaps the intermediate electrode ME2. The organic layer OR2 covers a stacked layer body of the base electrode BE2, the intermediate electrode ME2 and the lower electrode LE2. The upper electrode UE2 covers the organic layer OR2 and is in contact with the lower portion 61.

In the display element DE3, the intermediate electrode ME3 overlaps the base electrode BE3. The lower electrode LE3 overlaps the intermediate electrode ME3. The organic layer OR3 covers a stacked layer body of the base electrode BE3, the intermediate electrode ME3 and the lower electrode LE3, the intermediate electrode ME3 and the lower electrode LE3. The upper electrode UE3 covers the organic layer OR3 and is in contact with the lower portion 61.

Each of the intermediate electrodes ME1, ME2 and ME3 is a metal electrode formed of a third metal material different from the second metal material and does not include an oxide conductive layer formed of indium tin oxide (ITO), etc. The third metal material is aluminum or an aluminum alloy.

The thickness of each of the intermediate electrodes ME1, ME2 and ME3 should be preferably greater than or equal to 50 nm. Alternatively, the sum of the thicknesses of the base electrode BE1 and the intermediate electrode ME1, the sum of the thicknesses of the base electrode BE2 and the intermediate electrode ME2 and the sum of the thicknesses of the base electrode BE3 and the intermediate electrode ME3 should be preferably greater than or equal to 50 nm.

In this configuration example, similarly, no oxide conductive layer such as an ITO layer is present immediately under the organic layer OR1 in the aperture AP1. The stacked layer body of the base electrode BE1, the intermediate electrode ME1 and the lower electrode LE1 functions as a reflecting electrode which reflects the light emitted from the light emitting layer EML1 of the organic layer OR1.

Similarly, no oxide conductive layer is present immediately under the organic layer OR2 in the aperture AP2. The stacked layer body of the base electrode BE2, the intermediate electrode ME2 and the lower electrode LE2 functions as a reflecting electrode which reflects the light emitted from the light emitting layer EML2 of the organic layer OR2.

Similarly, no oxide conductive layer is present immediately under the organic layer OR3 in the aperture AP3. The stacked layer body of the base electrode BE3, the intermediate electrode ME3 and the lower electrode LE3 functions as a reflecting electrode which reflects the light emitted from the light emitting layer EML3 of the organic layer OR3.

Now, this specification explains the manufacturing method of the display device DSP described above.

The manufacturing method explained here is different from that of the configuration example explained above in respect that the process of forming the intermediate electrode ME1 is added before the formation of the lower electrode LE1 in process P5 shown in FIG. 8.

Figure 22:
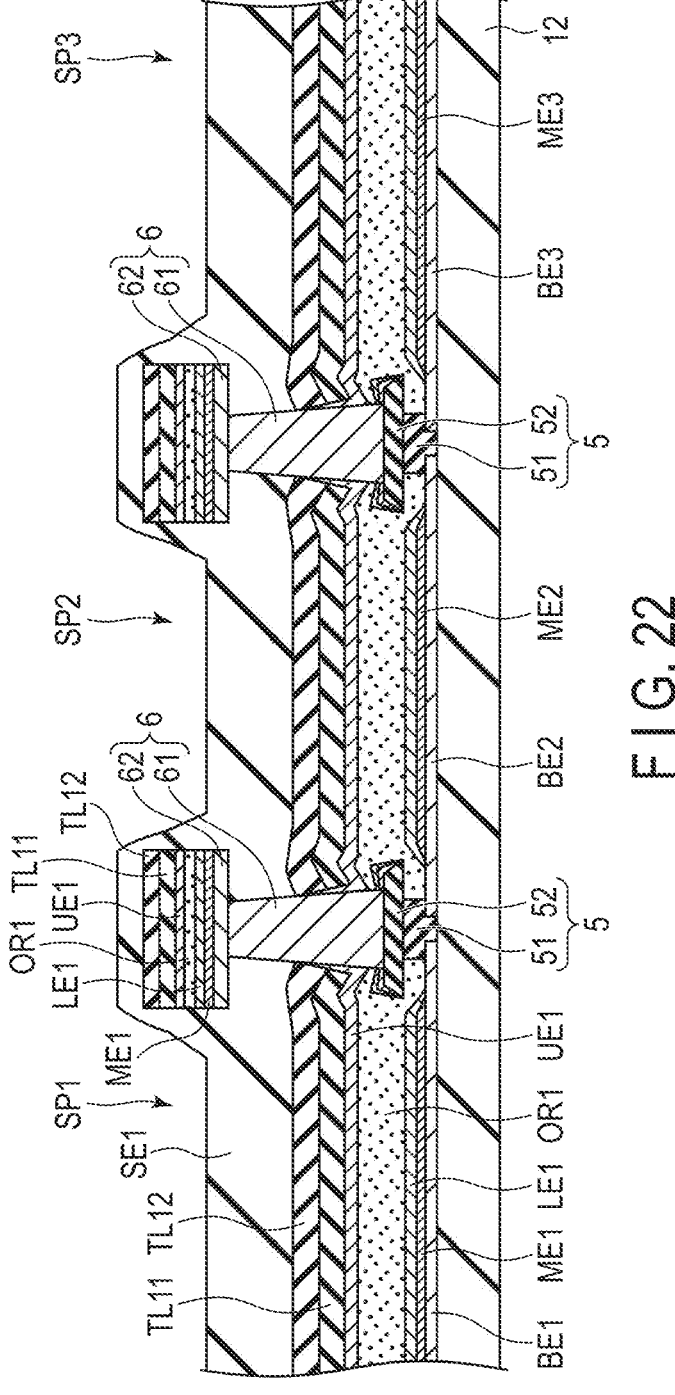
FIG. 22 is a schematic cross-sectional view showing the manufacturing process of the display device DSP shown in FIG. 21.

Specifically, as shown in FIG. 22, the intermediate electrode ME1 is formed by depositing the third metal material on the base electrodes BE1, BE2 and BE3 and the partition 6. The third metal material is aluminum. However, the third metal material may be an aluminum alloy. Subsequently, the lower electrode LE1 is formed by depositing the second metal material on the intermediate electrode ME1 (process P11). The second metal material is silver.

Subsequently, the organic layer OR1 is formed by depositing the materials for forming the hole injection layer, the hole transport layer, the electron blocking layer, the light emitting layer, the hole blocking layer, the electron transport layer, the electron injection layer, etc., on the lower electrode LE1 in series (process P12).

Subsequently, the upper electrode UE1 is formed by depositing a mixture of magnesium and silver on the organic layer OR1 (process P13).

Subsequently, the transparent layer TL11 is formed by depositing a high-refractive material on the upper electrode UE1. Further, the transparent layer TL12 is formed by depositing a low-refractive material on the transparent layer TL11. In this manner, the cap layer CP1 is formed (process P14). Further, the sealing layer SE1 is formed so as to cover the transparent layer TL12 and the partition 6 (process P15). The sealing layer SE1 is formed of silicon nitride (SiN) by CVD.

Subsequently, the resist R11 is provided on the sealing layer SE1 (process P16). Subsequently, the sealing layer SE1, the transparent layer TL12, the transparent layer TL11, the upper electrode UE1, the organic layer OR1 and the lower electrode LE1 are patterned in series using the resist R11 as a mask (process P17). Subsequently, the resist R11 is removed (process P18).

Subsequently, the display element DE2 is formed (process P6), and the display element DE3 is formed (process P7). Subsequently, the resin layer 14 and the sealing layer 15 are formed in order (process P8). By this process, the display device DSP is completed.

In this configuration example, effects similar to those of the configuration example explained previously can be obtained. In addition, even if a base electrode is damaged in the manufacturing process, as an intermediate electrode is formed using the same material as the base electrode immediately before the formation of a lower electrode, the reduction in the reflectance of the reflecting electrode can be prevented.

In the embodiment described above, for example, the color of the red wavelength range is assumed to correspond to a first color. The color of the green wavelength range is assumed to correspond to a second color. The color of the blue wavelength range is assumed to correspond to a third color.

The base electrode BE3 corresponds to a first base electrode. The base electrode BE2 corresponds to a second base electrode. The base electrode BE1 corresponds to a third base electrode.

The lower electrode LE3 corresponds to a first lower electrode. The lower electrode LE2 corresponds to a second lower electrode. The lower electrode LE1 corresponds to a third lower electrode.

The organic layer OR3 corresponds to a first organic layer. The organic layer OR2 corresponds to a second organic layer. The organic layer OR1 corresponds to a third organic layer.

The upper electrode UE3 corresponds to a first upper electrode. The upper electrode UE2 corresponds to a second upper electrode. The upper electrode UE1 corresponds to a third upper electrode.

The intermediate electrode ME3 corresponds to a first intermediate electrode. The intermediate electrode ME2 corresponds to a second intermediate electrode. The intermediate electrode ME1 corresponds to a third intermediate electrode.

All of the display devices and manufacturing methods thereof that can be implemented by a person of ordinary skill in the art through arbitrary design changes to the display device and manufacturing method thereof described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:
a substrate;
a first base electrode formed of a first metal material and provided above the substrate;
a rib comprising an aperture which overlaps the first base electrode;
a partition which includes a conductive lower portion provided on the rib and an upper portion protruding from a side surface of the lower portion;
a first lower electrode which is formed of a second metal material different from the first metal material, is spaced apart from the lower portion, is provided in the aperture and is electrically connected to the first base electrode;
a first organic layer configured to emit light which exhibits a first color and covering the first lower electrode; and
a first upper electrode which is provided on the first organic layer and is in contact with the lower portion, wherein
the rib comprises:
a first rib layer which is formed of a first inorganic insulating material and covers a peripheral portion of the first base electrode; and
a second rib layer which is formed of a second inorganic insulating material different from the first inorganic insulating material and is provided between the lower portion and the first rib layer, and the second rib layer protrudes from a side surface of the first rib layer and a side surface of the lower portion.

2. The display device of claim 1, wherein
a thickness of the first rib layer which overlaps the first base electrode is greater than a thickness of the first lower electrode.

3. The display device of claim 2, wherein
the thickness of the first rib layer is less than a total thickness of the first lower electrode and the first organic layer.

4. The display device of claim 1, wherein
a gap surrounded by the first rib layer, the second rib layer and the first base electrode is blocked by the first organic layer.

5. The display device of claim 1, wherein
part of the first lower electrode is located on the second rib layer and the upper portion and is spaced apart from a portion provided in the aperture.

6. The display device of claim 1, wherein
the first inorganic insulating material is silicon nitride, and the second inorganic insulating material is silicon oxide or silicon oxynitride.

7. The display device of claim 1, wherein
the first metal material is aluminum or an aluminum alloy, and
the second metal material is silver.

8. The display device of claim 1, wherein
the first lower electrode is in contact with the first base electrode.

9. The display device of claim 1, further comprising a first intermediate electrode interposed between the first base electrode and the first lower electrode, wherein the first intermediate electrode is formed of a third metal material different from the second metal material.

10. The display device of claim 9, wherein
the third metal material is aluminum or an aluminum alloy.

11. The display device of claim 1, further comprising:
second and third base electrodes provided above the substrate, spaced apart from the first base electrode and formed of the first metal material;
a second lower electrode electrically connected to the second base electrode and formed of the second metal material;
a second organic layer configured to emit light which exhibits a second color different from the first color and covering the second lower electrode;
a third lower electrode electrically connected to the third base electrode and formed of the second metal material; and
a third organic layer configured to emit light which exhibits a third color different from the first color and the second color and covering the third lower electrode, wherein
a thickness of the second lower electrode is different from a thickness of the third lower electrode.

12. The display device of claim 11, wherein
the first color is a color having a wavelength longer than the second color,
the second color is a color having a wavelength longer than the third color,
a thickness of the first lower electrode is equal to the thickness of the second lower electrode or greater than the thickness of the second lower electrode, and
the thickness of the second lower electrode is greater than the thickness of the third lower electrode.

13. The display device of claim 12, wherein
a thickness of each of the first base electrode, the second base electrode and the third base electrode is greater than or equal to 50 nm.

14. The display device of claim 12, wherein
the thickness of the third lower electrode is greater than or equal to 10 nm.

15. The display device of claim 12, wherein
the thickness of the third lower electrode is less than a thickness of the third base electrode.

16. The display device of claim 12, wherein
the thickness of the second lower electrode is equal to a thickness of the second base electrode or less than the thickness of the second base electrode.

17. A manufacturing method of a display device, comprising:
forming a metal layer using a first metal material above a substrate;
forming a first base electrode by patterning the metal layer;
forming a first insulating layer which covers the first base electrode by a first inorganic insulating material;
forming a second insulating layer using a second inorganic insulating material different from the first inorganic insulating material on the first insulating layer;
forming a partition which includes a conductive lower portion located on the second insulating layer and an upper portion protruding from a side surface of the lower portion;
forming a second rib layer which protrudes from a side surface of the lower portion by patterning the second insulating layer;

forming an aperture which overlaps the first base electrode by removing, of the first insulating layer, a portion exposed from the second rib layer, and forming a first rib layer having a width less than the second rib layer by reducing a width of the first insulating layer;

forming a first lower electrode electrically connected to the first base electrode by depositing a second metal material different from the first metal material;

forming a first organic layer on the first lower electrode; and forming a first upper electrode which is located on the first organic layer and is in contact with the lower portion.

18. The manufacturing method of claim 17, wherein the first metal material is aluminum or an aluminum alloy, and the second metal material is silver.

19. The manufacturing method of claim 17, further comprising forming a first intermediate electrode on the first base electrode by depositing a third metal material different from the second metal material before forming the first lower electrode.

20. The manufacturing method of claim 17, wherein the formation of the first lower electrode and the first organic layer is continuously performed in a vacuum environment.

\* \* \* \* \*